(12) United States Patent
Ichino et al.

(10) Patent No.: US 10,692,784 B2
(45) Date of Patent: Jun. 23, 2020

(54) VACUUM PROCESSING APPARATUS

(71) Applicant: HITACHI HIGH-TECH CORPORATION, Minato-ku, Tokyo (JP)

(72) Inventors: Takamasa Ichino, Tokyo (JP); Kohei Sato, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 151 days.

(21) Appl. No.: 15/715,717

(22) Filed: Sep. 26, 2017

(65) Prior Publication Data

US 2018/0211893 A1 Jul. 26, 2018

(30) Foreign Application Priority Data

Jan. 23, 2017 (JP) ................. 2017-009089

(51) Int. Cl.
*H01L 21/66* (2006.01)
*H01L 21/673* (2006.01)
(Continued)

(52) U.S. Cl.
CPC ............ *H01L 22/30* (2013.01); *H01L 21/673* (2013.01); *H01L 21/67011* (2013.01);
(Continued)

(58) Field of Classification Search
CPC .................................................. H01L 21/673
See application file for complete search history.

(56) References Cited

U.S. PATENT DOCUMENTS

| 5,558,717 A | 9/1996 | Zhao et al. |
| 2003/0003749 A1 | 1/2003 | Sexton et al. |

(Continued)

FOREIGN PATENT DOCUMENTS

| JP | H08-227859 A | 9/1996 |
| JP | 2005-516379 A | 6/2005 |

(Continued)

OTHER PUBLICATIONS

Satou—JP2016-018918,A translation machine (Year: 016).*

(Continued)

*Primary Examiner* — Joseph A Miller, Jr.
(74) *Attorney, Agent, or Firm* — Miles & Stockbridge, P.C.

(57) ABSTRACT

A sample stage which is disposed inside a vacuum processing chamber and on which a wafer to be processed is placed on an upper surface thereof includes a metallic base material, a metallic substrate insulated from the base material below the base material with an insulating member interposed therebetween, and a base which is disposed below the substrate, has a space set to an atmospheric pressure therein, and is connected to the substrate by an opening above the space being covered, the insulating member has a ring-shaped member made of ceramic with a seal member airtightly sealing a part between a space of an inner peripheral side communicating with an outside of the vacuum vessel and set to the atmospheric pressure and an inside of the processing chamber interposed between the base material and an outer peripheral side portion of the substrate, a plurality of temperature sensors installed to penetrate the substrate and inserted into the base material is included, and the base material, the insulating member, and the substrate are configured to be integrally removable to an outside of the processing chamber in a state in which the plurality of temperature sensors is installed.

9 Claims, 15 Drawing Sheets

(51) Int. Cl.
*H01L 21/67* (2006.01)
*H01L 21/677* (2006.01)

(52) U.S. Cl.
CPC .... *H01L 21/6719* (2013.01); *H01L 21/67126* (2013.01); *H01L 21/67248* (2013.01); *H01L 21/67288* (2013.01); *H01L 21/67748* (2013.01)

(56) References Cited

U.S. PATENT DOCUMENTS

2005/0193953 A1    9/2005    Makino
2015/0214014 A1    7/2015    Sato et al.

FOREIGN PATENT DOCUMENTS

| JP | 2005-252201 A | 9/2005 |
| JP | 2015-141908 A | 8/2015 |
| JP | 2016-018918 A | 2/2016 |
| KR | 10-2015-0089907 A | 8/2015 |

OTHER PUBLICATIONS

Office Action dated Aug. 13, 2018 for Korean Application No. 10-2017-0112446, machine translation (Year: 2018).*
Office Action dated Aug. 13, 2018 for Korean Application No. 10-2017-0112446.

* cited by examiner

VACUUM PROCESSING APPARATUS

BACKGROUND OF THE INVENTION

The present invention relates to a vacuum processing apparatus for processing a sample to be processed disposed on a sample stage in a depressurized processing chamber inside a vacuum vessel using plasma formed in the processing chamber.

In a vacuum processing apparatus that processes a workpiece such as a semiconductor wafer, for example, a workpiece such as a semiconductor wafer held on a sample stage including an electrostatic chuck is processed by introducing processing gas into a vacuum processing chamber in a depressurized state, putting the introduced processing gas in a plasma state, and causing a chemical reaction with a radical or electron sputtering.

In the vacuum processing apparatus, processing gas is used, and a reaction product adheres to an inside of the vacuum processing chamber when the processing gas is put in a plasma state to process a workpiece (wafer). When the reaction product adheres to a surface of a component disposed inside the processing chamber, there arises a problem that the reaction product becomes a fine particle, peels off from the surface due to deterioration of the component, and falls to adhere to the wafer, etc. as a foreign material, thereby contaminating the wafer. To suppress this problem, a reaction product, etc. that causes a foreign material is removed by periodically replacing or cleaning the component in the processing chamber, or a process of reproducing a surface of each component is performed (maintenance). During the maintenance, the inside of the processing chamber is open to an atmosphere of an atmospheric pressure, processing may not be performed, and operation of the apparatus is suspended. Thus, efficiency of processing decreases.

Further, recently, the semiconductor wafer corresponding to the workpiece has increased in diameter. For this reason, the vacuum processing apparatus increases in size, individual components included therein increase in size, and weights thereof tend to increase. In addition, it is not easy to remove, move, or mount the components, maintenance is expected to take a long time, and there is concern about a further decrease in maintenance efficiency.

For example, a technology for improving maintenance efficiency of such a vacuum processing apparatus is disclosed in JP-2005-252201-A. In addition, for example, an electrostatic chuck used in a vacuum processing chamber is disclosed in JP-2005-516379-A.

JP-2005-252201-A discloses a vacuum processing apparatus that includes an upper inner cylinder chamber and a sample stage included in a processing chamber for processing a workpiece inside an outer chamber, and a lower inner cylinder chamber disposed on an exhaust portion side. In the present vacuum processing apparatus, during maintenance, a discharge chamber base plate, which is disposed above the upper inner cylinder chamber and included in a discharge chamber for generating plasma, is lifted upward such that the discharge chamber base plate is rotated using a hinge portion disposed on a conveyance chamber side as a fulcrum, and the upper inner chamber is lifted upward and removed from the outer chamber by ensuring a work space for the upper inner chamber. Further, a technology is described. In this technology, a sample stage base plate, to which a ring-shape support base member (sample stage block) including a support beam disposed and fixed around an axis using a center of a sample stage in a vertical direction as an axis is fixed, is lifted upward such that the sample stage base plate is rotated using a hinge portion disposed on a conveyance chamber side as a fulcrum, and a lower inner chamber is lifted upward and removed from an outer chamber by ensuring a work space for the lower inner chamber. When support beams are axis-symmetrically disposed using a center of the sample stage in the vertical direction as an axis (that is, a gas flow path shape with respect to a center axis of the sample stage is substantially in axial symmetry with respect to the same axis), gas (processing gas, a particle in plasma, or a reaction product) in a space on the sample stage inside the upper inner cylinder chamber is discharged through the lower inner cylinder chamber by passing through a space between the support beams. In this way, a flow of gas in a circumferential direction of the workpiece becomes uniform, and uniform processing of the workpiece may be performed.

When the technology of lifting up the discharge chamber base plate and the sample stage base plate using the hinge portion as the fulcrum is applied to maintenance of a workpiece increased in diameter, the discharge base plate or the support beam to which the sample stage is fixed increase in size, and weights thereof increase. Thus, there is concern about having difficulty in lifting the discharge base plate or the support beam upward by hand, and difficulty in ensuring a workspace for the upper inner cylinder chamber or the lower inner cylinder chamber. In addition, maintenance of the exhaust portion is performed by peering from an upper portion of the outer chamber. However, there is concern about having difficulty in sufficient cleaning, etc. since a hand does not reach the portion due to an increase in size of the apparatus. Furthermore, there is concern about an unstable foothold in irregular maintenance such as maintenance or replacement of a component included in the discharge base plate or the sample stage which is lifted upward. Even when the discharge base plate or the support beam to which the sample stage is fixed is lifted up by a crane, etc., the two latter ones are not resolved.

In addition, JP-2005-516379-A discloses a cantilevered substrate support which may be attached to and detached from a vacuum processing chamber by passing through an opening provided in a side wall of the vacuum processing chamber (in a horizontal direction) and is mounted with an electrostatic chuck assembly. In a case in which this technology is applied to maintenance of a workpiece increased in diameter, since the substrate support is vacuum-sealed at an opening of a chamber-side wall, there is concern that load on a vacuum seal portion may increase when a weight increases, and it is difficult to maintain vacuum. In addition, a gas flow path shape with respect to a center axis of a sample support is not in axial symmetry with respect to the same axis due to a cantilever, so that a flow of gas in a circumferential direction of the workpiece becomes nonuniform, and it is considered that uniform processing on the workpiece becomes difficult.

As a technology for solving such a conventional technology, there has been a known technology for improving efficiency of maintenance by dividing the whole portion into a portion included in a sample stage or an electrostatic chuck and a plurality of portions disposed on upper and lower portions of the sample stage or the electrostatic chuck and then sealing the portions to form a vacuum vessel, rotating and moving the portion included in the sample stage or the electrostatic chuck in a horizontal direction of a main body of a processing unit in a state in which the portion is connected to a vacuum processing apparatus or the main body of the processing unit, and allowing the upper and lower portions to be successively removed. A technology disclosed in JP-2015-141908-A has been conventionally known as an example of such a technology.

JP-2015-141908-A discloses a vacuum processing apparatus having a vacuum vessel that includes a cylindrical lower container disposed on a base plate, a ring-shaped sample stage base that includes a support beam supporting a sample stage therein, a cylindrical upper container, a cylindrical discharge block, and a lid member made of a dielectric which closes an upper portion of the discharge block. In a processing unit of the present conventional technology, due to a microwave supplied into a processing chamber, which is formed inside the vacuum vessel by sealing members of the vacuum vessel, by permeating the lid member or a high frequency electric field in a very high frequency (VHF) or ultra high frequency (UHF) band and a magnetic field from a solenoid coil disposed to surround a periphery of an upper part and a side part of the discharge block, an atom or a molecule of processing gas supplied into the processing chamber is excited to form plasma, and a substrate-shaped sample such as a semiconductor wafer placed and held above an upper surface of the sample stage is processed.

Further, at the time of performing maintenance such as cleaning or replacement and inspection on a member included in the vacuum vessel or a member included in a surface inside the processing chamber, after setting a pressure of an inside of the processing chamber to atmospheric pressure or a pressure value approximate to a degree that may be regarded as the atmospheric pressure, the lid member or the discharge block is separated from others, the upper container is removed, or the sample stage base is horizontally rotated for each sample stage and moved and evacuated from the lower container on a lower side or the base plate and an upper side of a vacuum pump such as a turbo molecular pump disposed below the base plate. An operator who performs replacement, maintenance, and inspection of the upper container or the lower container, or replacement, maintenance and inspection operations of the sample stage or a component connected thereto may ensure a sufficient space to perform the operations in a state in which each component is removed from another component or another component is evacuated, improve efficiency of work, and shorten a time during which the vacuum processing apparatus does not process the sample to improve efficiency operation thereof.

SUMMARY OF THE INVENTION

In the above-described conventional technologies, problems have occurred since consideration on the following points was insufficient.

That is, normally, a sample such as a semiconductor wafer is processed at a temperature within a range suitable or allowed for processing, and a detector such as a sensor for detecting a temperature is disposed on a sample stage to detect the temperature of the sample stage in order to adjust the temperature of the sample stage or the sample within the range. Such a detector may output a different value for a value of the same temperature when a state of being attached to the sample stage varies. Thus, there is a need to perform calibration for setting or correcting a value of an output with respect to a specific temperature which is known in advance.

In a sample stage including a plurality of detectors, calibration work needs to be performed after mounting on the sample stage as many times as the number of detectors mounted on the sample stage. Meanwhile, since an upper surface or a side surface of the sample stage is a member included in an inner surface of the processing chamber facing plasma, a portion included in the sample stage corresponding to the member included in the inner surface needs to be removed and washed, cleaned, or replaced in the above-described maintenance operation in order to remove an adhering substance such as a reaction product generated during processing which is attached to the surface as the cumulative number of processes of the sample starting from a state in which the surface is clean increases.

In a case in which a portion on which the detector is mounted corresponds to an object to be replaced in the above-described conventional technology, an operation of calibrating the detector is needed for each maintenance operation, and thus a time during which the vacuum processing apparatus does not process the sample increases to impair efficiency or a rate of operation or efficiency of processing. The above-described conventional technology insufficiently considers such a problem, and problems have occurred.

An object of the invention is to provide a vacuum processing apparatus that improves an operation rate or efficiency of processing by shortening a time during which an operation such as maintenance, inspection, etc. is performed, and thus a sample is not processed.

The object is achieved by a vacuum processing apparatus including: a processing chamber disposed inside a vacuum vessel and depressurized by an inside being evacuated, a sample stage disposed inside the processing chamber, a wafer to be processed being disposed on an upper surface of the sample stage, and an opening communicating with an exhaust pump disposed below the sample stage to evacuate the inside of the processing chamber. The wafer is processed using plasma generated in the processing chamber above the sample stage, and the sample stage includes a metallic base material having a film made of a dielectric, the wafer being placed on an upper surface thereof, a metallic base plate disposed below the base material and insulated from the base material with an insulating member interposed therebetween, and a cylindrical base member which is disposed below the base plate and which surrounds a space which is set to an atmospheric pressure therein, and the base material and the insulating member being fastened to the base plate, and the base plate being connected to the cylindrical base member so as to cover said space. The insulating member includes a ring-shaped first member having a large rigidity disposed in an outer peripheral region of the insulating member to interpose a seal member airtightly sealing an inner peripheral side space which communicates with an outside of the vacuum vessel and set to an atmospheric pressure from an inside of the processing chamber on outer peripheral regions of the base material and the base plate, and a plate-shaped second member having a small rigidity disposed in a region on an inner periphery side of the first member. The vacuum processing apparatus further comprises a plurality of temperature sensors each of which penetrates the base plate and the second member of the insulating member, and which is inserted into the base material, and the base plate fastened to the base material and the insulating member are removable upward to an outside of the processing chamber from the base material in a state in which the plurality of temperature sensors is installed.

According to the invention, it is possible to provide a vacuum processing apparatus that improves efficiency of processing.

BRIEF DESCRIPTION OF THE DRAWINGS

FIGS. 14A and 14B are longitudinal sectional views schematically illustrating a state in which the sample stage according to the embodiment illustrated in FIGS. 12A and 12B and FIGS. 13A and 13B is disassembled into a plurality of components.

DESCRIPTION OF THE EMBODIMENTS

The inventors recalled the following points as a means for achieving the above object. That is, (1) in order to ensure excellent processing uniformity, a processing chamber shape is formed to be substantially in axial symmetry with respect to a central axis of a sample stage on which a workpiece is placed.

(2) In order to allow easy regular maintenance, a reaction product, etc. may be rapidly removed from a chamber member corresponding to a component subjected to regular maintenance in response to an increase in diameter. Here, the easy regular maintenance includes eliminating an operation performed during irregular maintenance such as disconnecting a power cable, performing water cooling purge, etc. (3) In order to allow easy irregular maintenance, a discharge electrode head or various sensors to be subjected to irregular maintenance may be easily extracted in response to an increase in diameter.

Further, configurations below have been conceived as configurations for implementing the above description.

With regard to item (1), at least an inner wall shape of a horizontal cross section of a vacuum processing chamber has a circular shape, and a support beam for supporting a sample stage is disposed in axial symmetry using a center of the sample stage in a vertical direction as an axis and fixed to a ring-shaped support base member. With regard to item (2), a component subjected to regular maintenance may be swapped (exchanged). That is, a component to which a reaction product, etc. adheres may be replaced with a new component or a cleaned component without being cleaned on the spot. Further, components to be subjected to irregular maintenance are grouped into units for each related component and are allowed to move in a horizontal direction on a unit basis, and avoidance is facilitated such that these components do not hinder operation during regular maintenance. With regard to item (3), units into which components to be subjected to irregular maintenance are grouped for each related component are moved in the horizontal direction during maintenance, and a work space is provided around the units.

In an embodiment described below, a description will be given of an example having a configuration for achieving the above object in a vacuum processing apparatus having such a configuration. In drawings, the same reference symbol indicates the same component.

Embodiment

Figure 1A:
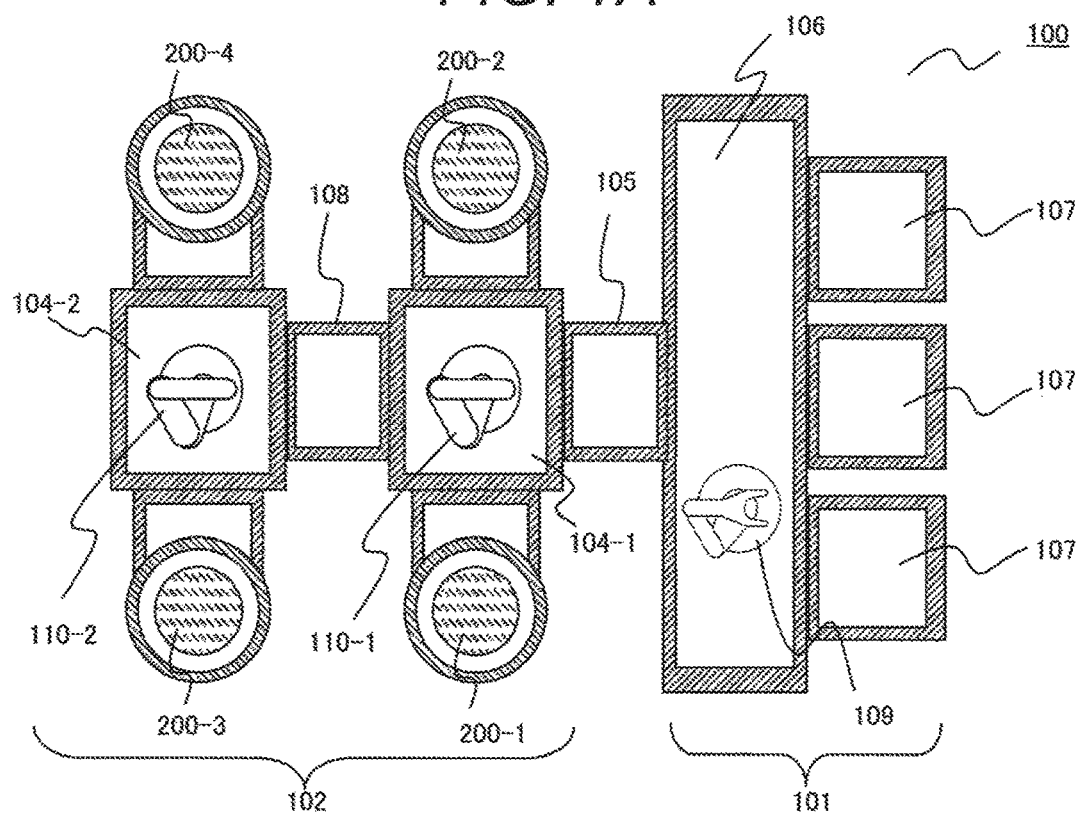
FIGS. 1A and 1B are a top view and a perspective view for description of an outline of a configuration of a vacuum processing apparatus according to an embodiment of the invention.
Figure 1B:
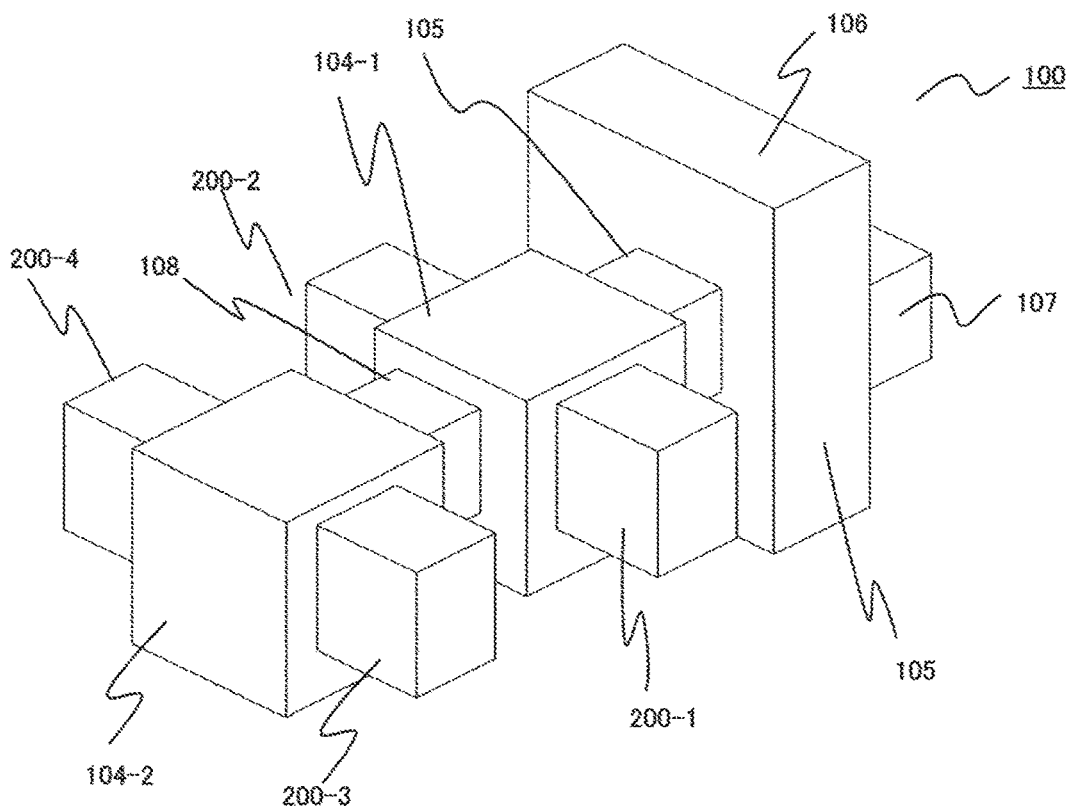

Hereinafter, a vacuum processing apparatus according to an embodiment of the invention will be described with reference to FIGS. 1A and 1B to FIGS. 11A and 11B. FIGS. 1A and 1B are a top view and a perspective view for description of an outline of a configuration of the vacuum processing apparatus according to the embodiment of the invention.

A plasma processing apparatus corresponding to the vacuum processing apparatus 100 of the present embodiment includes an atmosphere block 101 and a vacuum block 102. The atmosphere block 101 is a portion for conveying, storing and positioning a workpiece (sample) such as a semiconductor wafer under atmospheric pressure, and the vacuum block 102 is a portion for conveying a sample such as a wafer under pressure reduced from atmospheric pressure, performing a treatment, etc., and raising or lowering the pressure in a state in which the sample is placed.

The atmosphere block 101 includes an atmosphere conveyance chamber 106 and a plurality of cassette stands 107 attached to a front surface side of the atmosphere conveyance chamber 106, and a cassette storing a sample for processing or cleaning is placed on an upper surface thereof. The atmosphere block 101 is a place in which a wafer for processing or cleaning stored inside each cassette on the cassette stands 107 is exchanged with the vacuum block 102 connected to a back surface of the atmosphere conveyance chamber 106. Further, an atmosphere conveyance robot 109 including a wafer holding arm is disposed inside the atmosphere conveyance chamber 106 to convey such a wafer.

The vacuum block 102 includes a plurality of vacuum processing chambers 200-1, 200-2, 200-3, and 200-4 depressurized to process a sample, vacuum conveyance chambers 104-1 and 104-2 which are connected to the vacuum processing chambers and include vacuum conveyance robots 110-1 and 110-2 conveying the sample under reduced pressure therein, a lock chamber 105 connecting the vacuum conveyance chamber 104-1 and the atmosphere conveyance chamber 106 to each other, and an conveyance intermediate room 108 connecting the vacuum conveyance chamber 104-1 and the vacuum conveyance chamber 104-2 to each other. The vacuum block 102 includes a unit, which can be maintained at a pressure corresponding to a high degree of vacuum by being depressurized, therein. Operation of the atmosphere conveyance robot or the vacuum conveyance robots, or control of processing in the vacuum processing chamber is performed by a control device.

Figure 3:
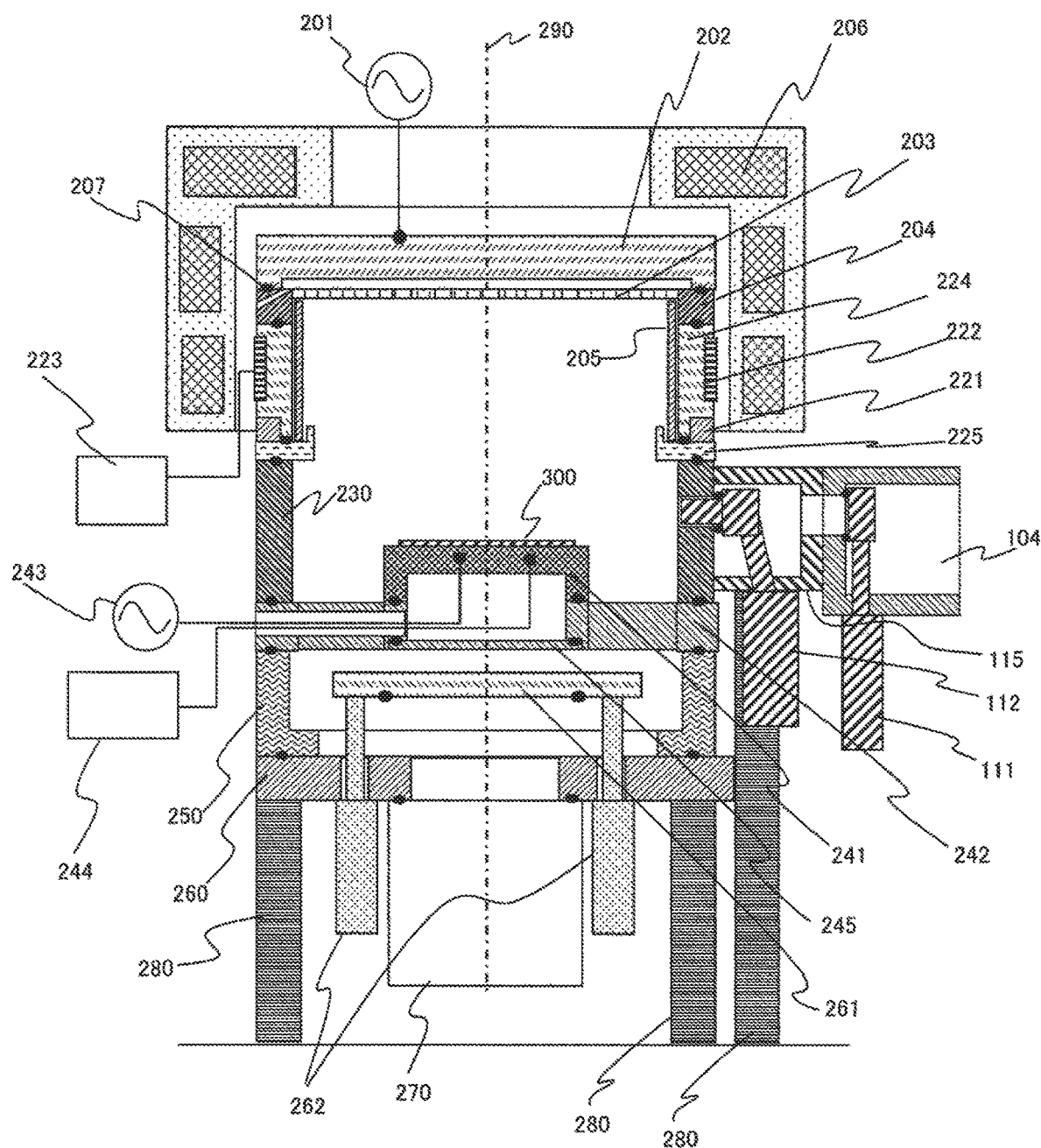
FIG. 3 is a longitudinal sectional view schematically illustrating an outline of a configuration of a vacuum processing chamber of the embodiment illustrated in FIGS. 1A and 1B.

FIG. 3 is a longitudinal sectional view schematically illustrating an outline of a configuration of the vacuum processing chamber of the embodiment illustrated in FIGS. 1A and 1B. In particular, FIG. 3 illustrates a schematic view of a configuration of a vacuum processing chamber in a vacuum processing chamber 200. In the present embodiment, vacuum processing chambers having the same structure are disposed. However, a vacuum processing chamber having another structure may be incorporated.

The vacuum processing chamber illustrated in FIG. 3 includes a vacuum vessel having an upper container 230 and a lower container 250, an exhaust pump 270 on a lower side connected thereto, and a first high frequency power supply 201 and a solenoid coil 206 on an upper side. The upper container or the lower container has an inner wall whose horizontal cross-sectional shape is a circular shape, and a cylindrical sample stage 241 is disposed at a central portion therein.

An outer wall of the upper container or the lower container is included in a vacuum partition wall. The sample stage 241 is held by support beams provided on a sample stage base 242, and the support beams are disposed in axial symmetry using a center of the sample stage in the vertical direction as an axis (that is, a gas flow path shape of the sample stage with respect to a central axis 290 is substantially in axial symmetry with respect to the same axis).

Since gas, etc. (processing gas, a particle in plasma, or a reaction product) in a space on the sample stage 241 inside the upper container 230 is discharged through the lower container 250 by passing through a space between the support beams, a flow of gas in a circumferential direction of the sample stage 241 on which a workpiece (sample) 300 is placed becomes uniform, and uniform processing of the workpiece 300 may be performed. The sample stage base 242 has a ring shape having a support beam, and this ring portion is held around the lower container and the upper container corresponding to the vacuum vessel and vacuum-sealed, and thus it is possible to respond to an increase in weight of the sample stage, etc.

In the present embodiment, the vacuum processing chamber has a plurality of members including the cylindrical lower container 250, the ring-shaped sample stage base 242 having the support beam, the cylindrical upper container 230, an earth ring 225, a cylindrical discharge block 224, and a gas introduction ring 204 successively stacked on the base plate 260, and each of the members is vacuum-sealed by an O-ring 207. A cylindrical quartz inner cylinder 205 is disposed inside the discharge block 224. In addition, the sample stage 241 having a sample stage bottom lid 245 is fixed to the sample stage base 242 to form a sample stage unit, and the discharge block 224 to which a heater 222 is attached is fixed to a discharge block base 221 to form a discharge block unit.

In addition, the upper container 230, the lower container 250, and the base plate 260 have flange portions, and the upper container 230 and the lower container 250 are screwed to the base plate 260 by the flange portions, respectively. In the present embodiment, the members included in the vacuum processing chamber have a cylindrical shape. However, a horizontal cross-sectional shape of an outer wall shape may not correspond to a circular shape and may correspond to a rectangular shape or another shape.

A lid member 202 having a disc shape included in a vacuum vessel and a disc-shaped shower plate 203 included in a ceiling surface of the vacuum processing chamber below the lid member 202 are disposed above the vacuum processing chamber. The lid member 202 and the shower plate 203 are made of a dielectric material such as quartz. For this reason, these members are configured to be able to transmit a high frequency electric field such as a microwave, a UHF or VHF wave, etc., and an electric field from the first high frequency power supply disposed above is supplied into the vacuum processing chamber through these members. In addition, a magnetic field forming means (solenoid coil) 206 is disposed on an outer periphery of an outer side wall of the vacuum vessel to surround the outer periphery, and a generated magnetic field may be supplied into the vacuum processing chamber.

Introduction holes for processing gas corresponding to a plurality of through-holes are disposed in the shower plate 203, and the processing gas introduced from the gas introduction ring 204 is supplied into the vacuum processing chamber through the introduction holes. A plurality of introduction holes of the shower plate 203 is disposed in a region in axial symmetry around the central axis 290 of the sample stage 241 above a placement surface of the sample corresponding to an upper surface of the sample stage 241, and processing gas having a predetermined composition and containing different gas components is introduced into the vacuum processing chamber through the uniformly disposed introduction holes.

The processing gas introduced into the vacuum processing chamber is excited when an electromagnetic wave and a magnetic field generated by the first high frequency power supply 201 serving as electric field forming means and the solenoid coil 206 serving as magnetic field forming means are supplied into the vacuum processing chamber, and put in a plasma state in a space inside the discharge block 224 above the sample stage 241. In this instance, processing gas molecules are ionized into electrons and ions, or dissociated into radicals. A periphery of a region in which plasma is generated is surrounded by the discharge block 224 disposed on the discharge block base 221, and the heater 222 connected to a first temperature controller 223 is mounted on an outer circumferential side wall of the discharge block 224 to surround the discharge block 224 and may heat the quartz inner cylinder 205 in contact with plasma.

According to such a configuration, it is possible to reduce adhesion of the reaction product to the quartz inner cylinder 205 or the discharge block 224. For this reason, these members may be excluded from an object of regular maintenance.

The sample stage 241 on which the wafer is placed is disposed inside the vacuum processing chamber to correspond to the central axis 290 of the shower plate 203. When processing by plasma is carried out, the processing is carried out in a state in which the wafer corresponding to the workpiece 300 is placed on the circular placement surface which is the upper surface of the sample stage 241 and is attracted and held by film static electricity of the dielectric included in this surface (electrostatic chuck).

In the present embodiment, considering that a semiconductor wafer as a sample having a diameter of 450 mm is used, an inner diameter of the cylindrical vacuum processing chamber is set to 800 mm. However, the inner diameter may be set to a value less than this dimension (about 600 mm).

In addition, a high frequency bias power supply (second high frequency power supply) 243 is connected to an electrode disposed inside the sample stage 241, and an etching process proceeds by a mutual reaction between a physical reaction caused by attracting and colliding a charged particle in plasma with the surface of the sample by a high frequency bias formed above the sample stage 241 and the sample 300 placed thereon by supplied high frequency power and a chemical reaction between the radical and the wafer surface. In addition, a temperature of the sample stage may be adjusted to a desired temperature by a second temperature controller 244.

The application of the high frequency bias to the sample stage 241 and the temperature control of the sample stage 241 are carried out through a power source wiring cord disposed in a cavity formed inside the sample stage base 242 including the support beam, a wiring cord for temperature control, or a refrigerant pipe. Although not illustrated, it is possible to include a temperature sensor or a wiring cord for the electrostatic chuck in addition to the wiring cord. Since a reaction product easily adheres to the upper container 230 disposed around the sample stage 241, the upper container 230 is a member subjected to regular maintenance.

The exhaust pump 270 connected to a bottom of the vacuum processing chamber through the base plate 260 having an exhaust opening is disposed at a lower side of the vacuum processing chamber. The exhaust opening provided in the base plate 260 is disposed immediately below the sample stage 241 and may adjust exhaust conductance by vertically moving an exhaust portion lid 261 having a substantially disc shape disposed above the exhaust opening using a cylinder 262. Further, the amount and speed of gas, plasma, and product on the inside discharged to the outside of the vacuum processing chamber by the exhaust pump 270 are adjusted.

The exhaust portion lid 261 is opened when the workpiece is processed, and a pressure in a space inside the vacuum processing chamber is maintained at a desired degree of vacuum by a balance between supply of the processing gas and an operation of exhaust means such as the exhaust pump 270. In the present embodiment, the pressure during the processing is adjusted to a predetermined value in a range of 0.1 to 4 Pa.

In the present embodiment, a roughing vacuum pump such as a turbo molecular pump, a rotary pump provided in a building in which the vacuum processing apparatus is installed, etc. is used as the exhaust pump. The exhaust portion lid 261 is configured to be closed during maintenance and to vacuum-seal the exhaust pump using an O-ring.

Further, in the present embodiment, reference numeral 111 denotes a first gate valve, reference numeral 112 denotes a second gate valve, reference numeral 115 denotes a valve box, and reference numeral 280 denotes a support column.

In the present embodiment, the processing gas introduced into the vacuum processing chamber and the plasma or the reaction product at the time of processing move from an upper part of the vacuum processing chamber up to the opening provided in the base plate 260 at the lower side through the lower container 250 by passing through a space on an outer peripheral side of the sample stage 241 by an operation of the exhaust means such as the exhaust pump 270. Since the reaction product easily adheres to the lower container 250, the lower container 250 is a member subjected to regular maintenance.

A pressure inside the vacuum processing chamber during the etching process is monitored by a vacuum gauge (not illustrated), and the pressure inside the vacuum processing chamber is controlled by controlling an exhaust speed by the exhaust portion lid 261. The supply of the processing gas and operations of the electric field forming means, the magnetic field forming means, the high frequency bias, and the exhaust means are controlled by a control device (not illustrated) connected such that communication therewith is allowed.

A gas of a single type or a gas obtained by mixing a plurality of types of gases at an optimum flow ratio is used as the processing gas, which is used for plasma processing, for each process condition. A flow rate of the mixed gas is adjusted by a gas flow rate controller (not illustrated), and the mixed gas is introduced into a space for gas retention between the lid member 202 and the shower plate 203 above the vacuum processing chamber above the vacuum vessel through the gas introduction ring 204 connected thereto. In this embodiment, a gas introduction ring made of stainless steel is used.

Figure 2A:
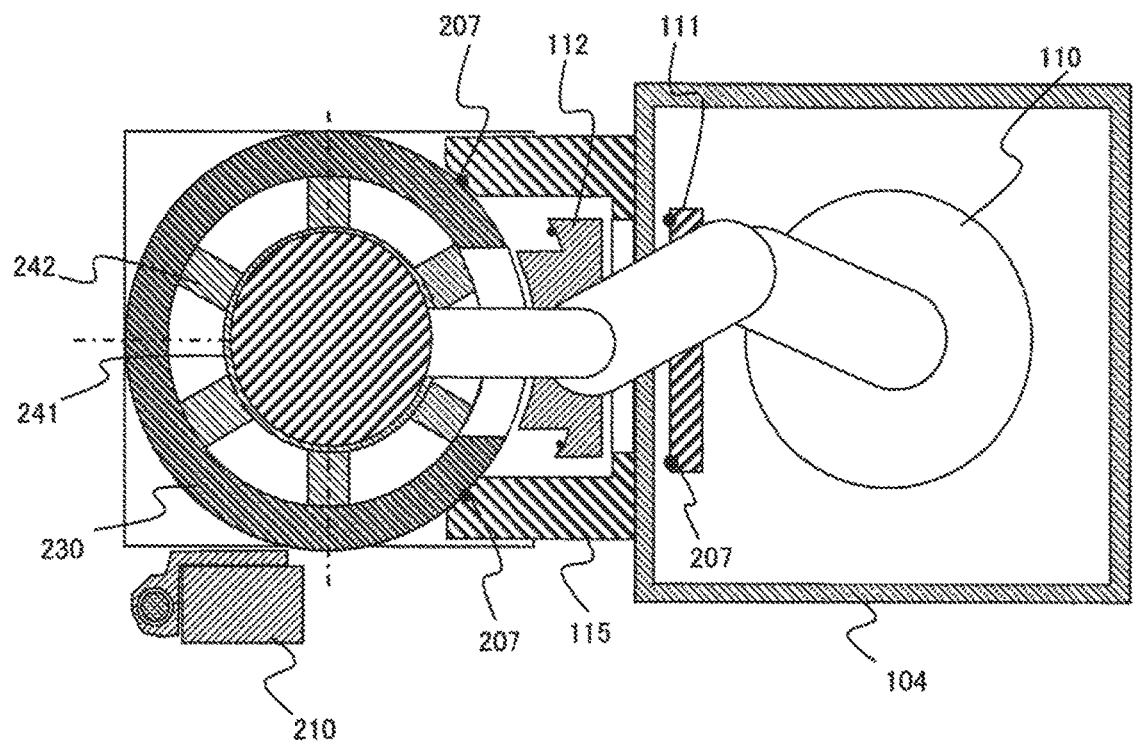
FIGS. 2A and 2B are schematic top views of a main part for description of conveyance of a workpiece in the vacuum processing apparatus according to the embodiment illustrated in FIGS. 1A and 1B.
Figure 2B:
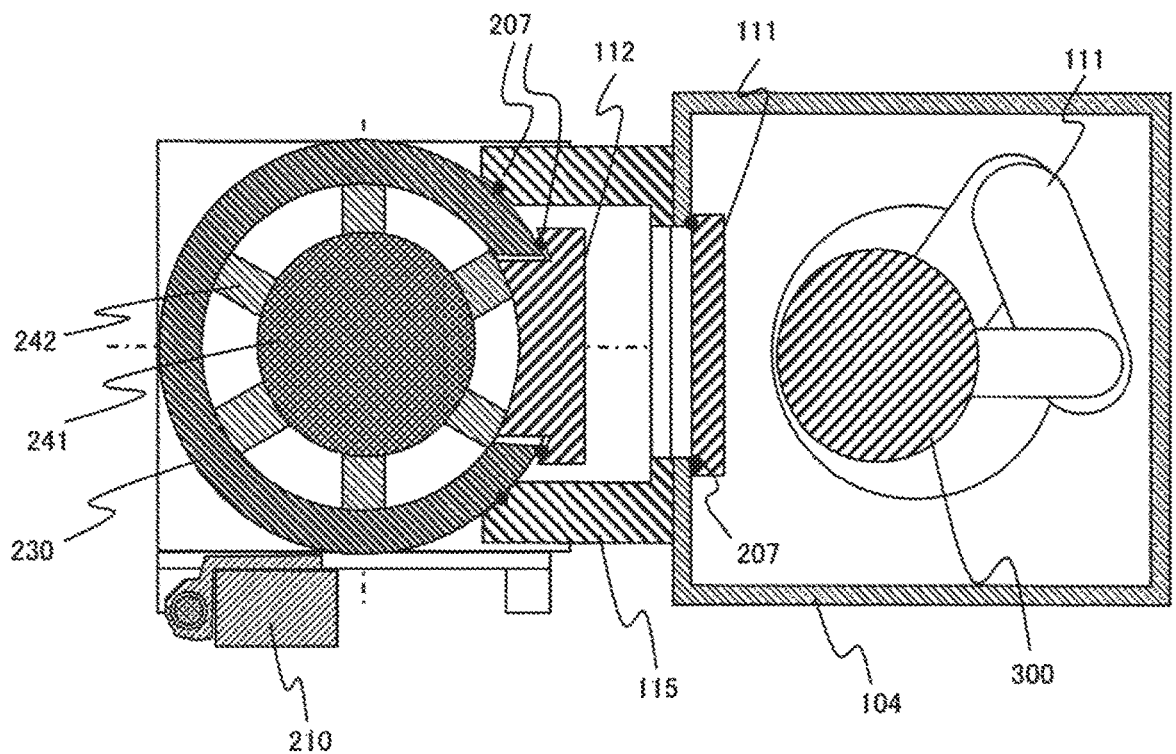

Next, a description will be given of a procedure of loading the workpiece into the vacuum processing chamber and unloading the workpiece from the vacuum processing chamber with reference to FIGS. 2A and 2B to FIG. 4. FIGS. 2A and 2B are schematic top views of a main part for description of conveyance of the workpiece in the vacuum processing apparatus according to the embodiment illustrated in FIGS. 1A and 1B.

FIG. 2A illustrates a state in which the gate valve is in an open, and a state in which a conveying robot carries the workpiece into the vacuum processing chamber or attempts to carry the workpiece out. FIG. 2B illustrates a state in which a wafer 300 is loaded into a vacuum conveyance chamber 104 and the gate valve is closed, and a state in which the workpiece is loaded into the vacuum conveyance chamber.

First, in the atmospheric block, the wafer taken out by the atmosphere conveyance robot from the cassette is conveyed to the vacuum conveyance chamber 104 through the lock chamber. The vacuum processing chamber and the vacuum conveyance chamber are connected through the first gate valve 111 and the second gate valve.

In this figure, both the gate valves are closed and vacuum-sealed using the O-ring 207. Reference numeral 115 denotes a valve box, and reference numeral 210 denotes a turning lifter (moving means).

The turning lifter 210 will be described below. Subsequently, after setting pressures of the vacuum processing chamber and the vacuum conveyance chamber to the same pressure, the wafer 300 is loaded into the vacuum processing chamber from the vacuum conveyance chamber 104 using a vacuum conveyance robot 110 having an arm as illustrated in FIG. 2A.

In this instance, both the first and second gate valves 111 and 112 are in an open state. Subsequently, as illustrated in FIG. 3, the wafer 300 is placed on the sample stage 241 in the vacuum processing chamber, the vacuum conveyance robot is returned to the vacuum conveyance chamber, and the first and second gate valves 111 and 112 are closed.

Figure 4:
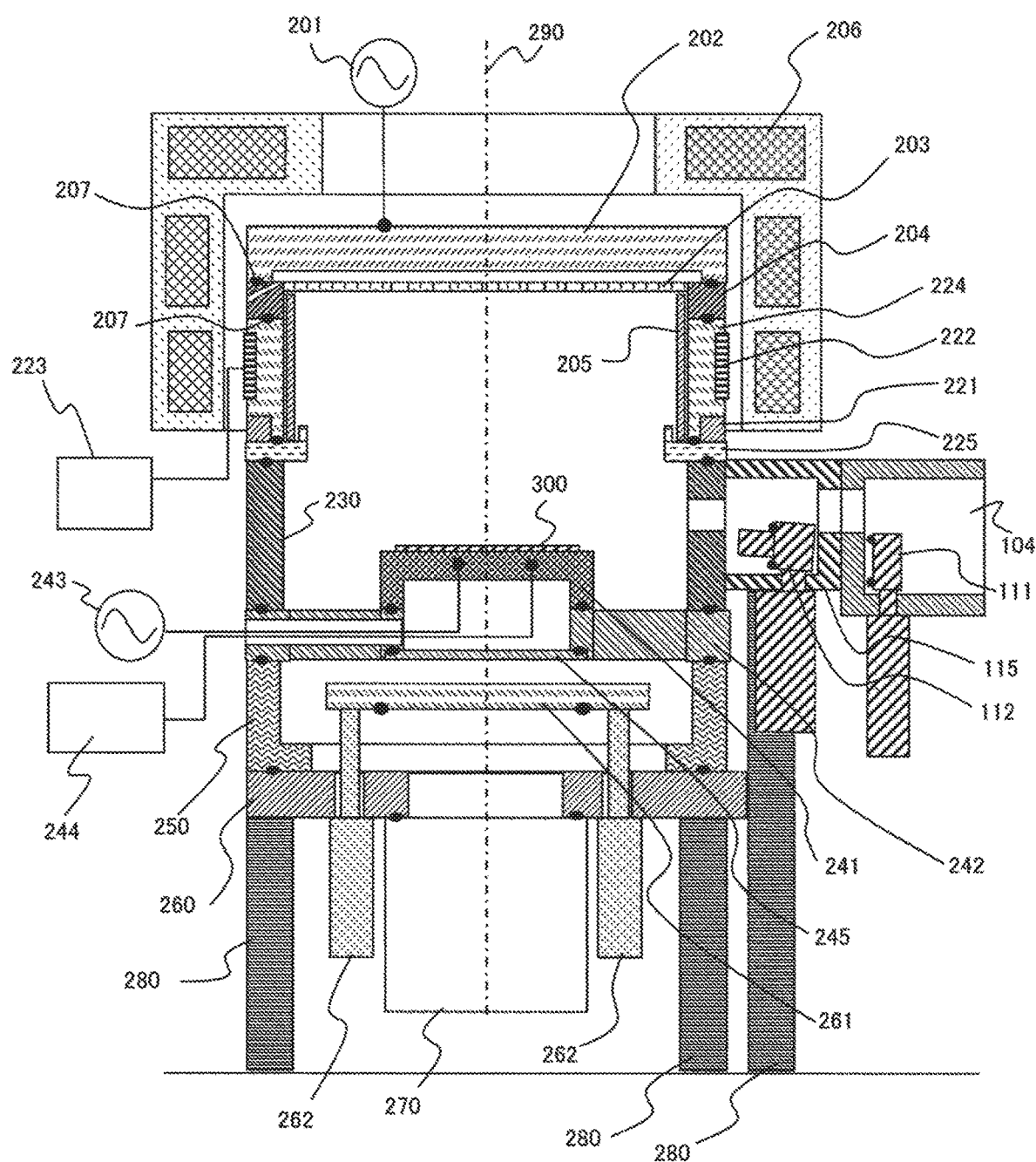
FIG. 4 is a longitudinal sectional view schematically illustrating an outline of a configuration of the vacuum processing chamber of the embodiment illustrated in FIGS. 1A and 1B.

Upon completion of the processing on the wafer 300 in the vacuum processing chamber, after adjusting the pressures of the vacuum processing chamber and the vacuum conveyance chamber, the first and second gate valves 111 and 112 are opened as illustrated in FIG. 4. FIG. 4 is a longitudinal sectional view schematically illustrating an outline of a configuration of the vacuum processing chamber of the embodiment illustrated in FIGS. 1A and 1B, and illustrates a state in which the first and second gate valves 111 and 112 are open.

From this state, the wafer 300 is lifted upward from the sample stage 241 using the vacuum conveyance robot 110 in the same manner as illustrated in FIG. 2A, and is released from the upper surface of the sample stage 241. Subsequently, as illustrated in FIG. 2B, the wafer 300 is loaded in the vacuum conveyance chamber 104. Thereafter, the wafer 300 is conveyed to the cassette through the lock chamber after being processed in another vacuum processing chamber or without being processed.

Figure 5A:
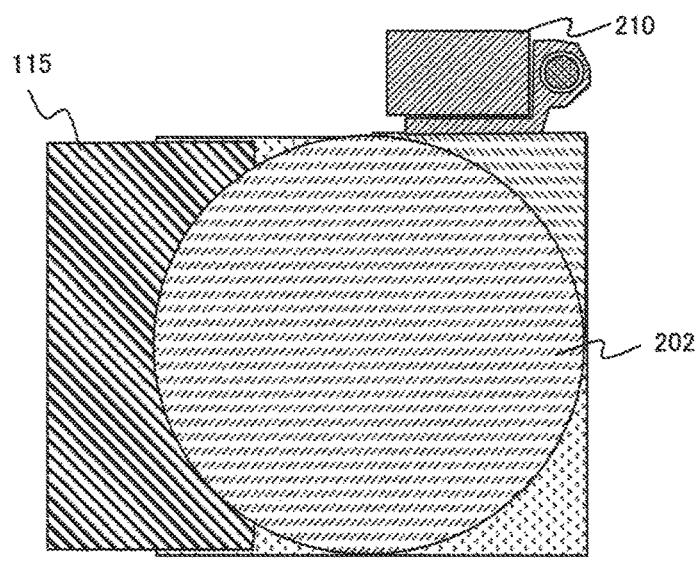
FIGS. 5A and 5B are a top view and a longitudinal sectional view for description of a procedure of maintenance in the vacuum processing chamber of the vacuum processing apparatus according to the embodiment of the invention illustrated in FIGS. 1A and 1B.
Figure 5B:
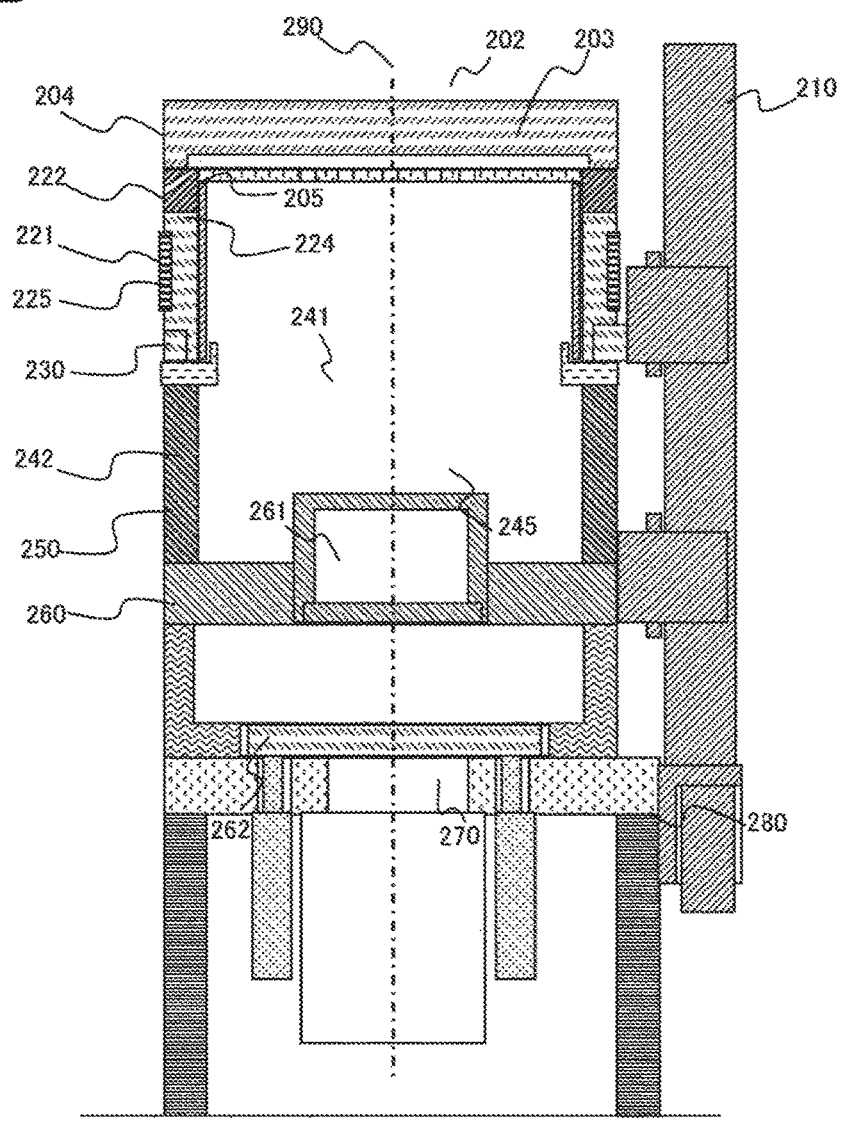

Next, a description will be given of a procedure of regular maintenance with reference to FIGS. 5A and 5B to FIGS. 11A and 11B. FIGS. 5A and 5B illustrate a configuration in which the solenoid coil 206 and the first high frequency power supply 201 are removed from the configuration of the vacuum processing chamber illustrated in FIGS. 3 and 4, and the opening of the base plate 260 connected to the exhaust pump 270 is closed and vacuum-sealed by the exhaust portion lid 261. FIG. 5A is a plan view, and FIG. 5B is a cross-sectional view.

When the exhaust pump 270 is vacuum-sealed by the exhaust portion lid 261, and the exhaust pump 270 is operated, it is possible to shorten a start-up time of the vacuum processing chamber after maintenance. The cross-sectional view illustrated in FIG. 5B is different from FIG. 3 and FIG. 4 in viewing direction to describe the turning lifter 210.

In more detail, while the cross-sectional view illustrated in FIG. 3 or FIG. 4 is a diagram viewed from a right side in the plan view illustrated in FIG. 5A, the cross-sectional view illustrated in FIG. 5B is a diagram viewed from below in the plan view illustrated in FIG. 5A. The longitudinal sectional views illustrated in FIGS. 6B to 11B are diagrams viewed from the same direction as that in the cross-sectional view illustrated in FIG. 5B.

Figure 6A:
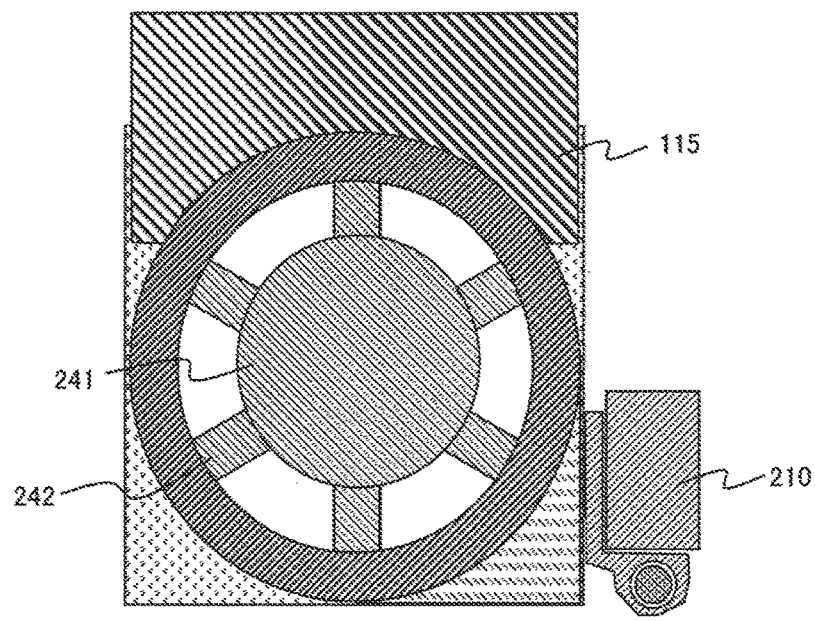
FIGS. 6A and 6B are a top view and a longitudinal sectional view for description of the procedure of maintenance in the vacuum processing chamber of the vacuum processing apparatus according to the embodiment of the invention illustrated in FIGS. 1A and 1B.
Figure 6B:
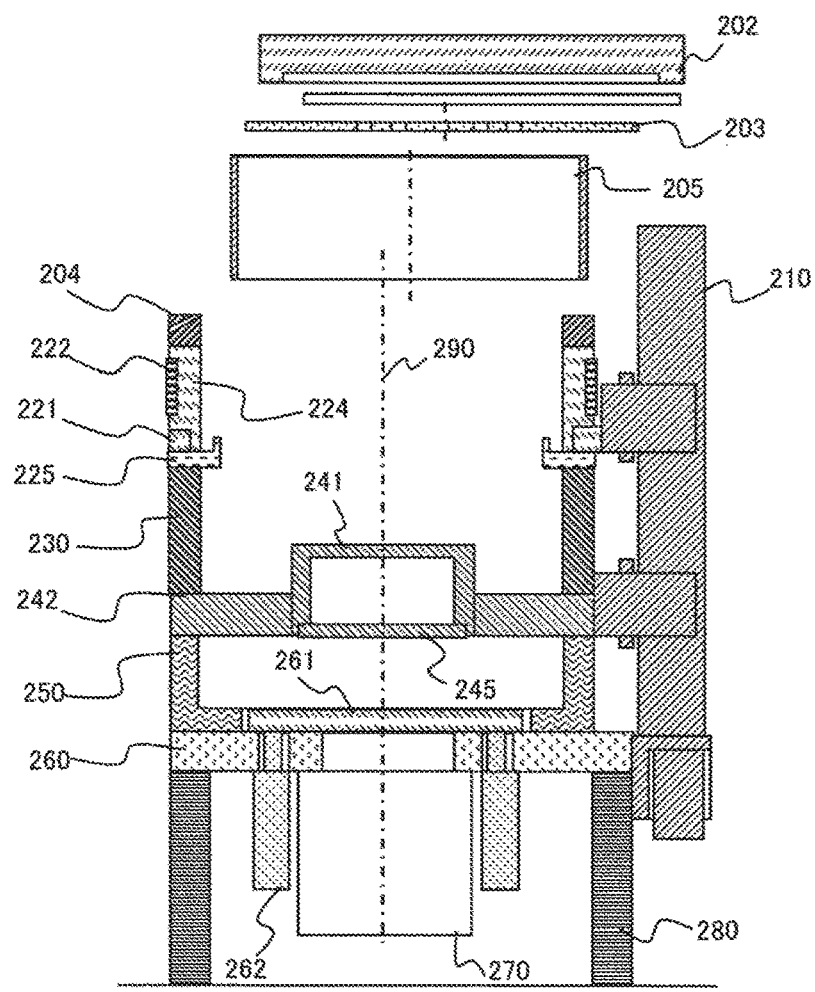

Subsequently, as illustrated in FIGS. 6A and 6B, a quartz plate 202, the shower plate 203 and the quartz inner cylinder 205 below the quartz plate 202 are moved upward and removed. In this way, the gas introduction ring 204 is exposed at an upper end of the vacuum processing chamber.

Figure 7A:
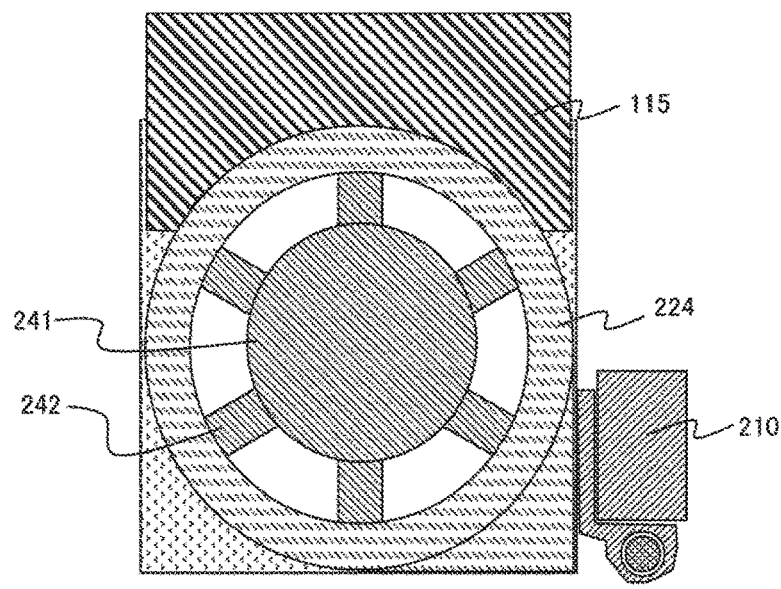
FIGS. 7A and 7B are a top view and a longitudinal sectional view for description of the procedure of maintenance in the vacuum processing chamber of the vacuum processing apparatus according to the embodiment of the invention illustrated in FIGS. 1A and 1B.
Figure 7B:
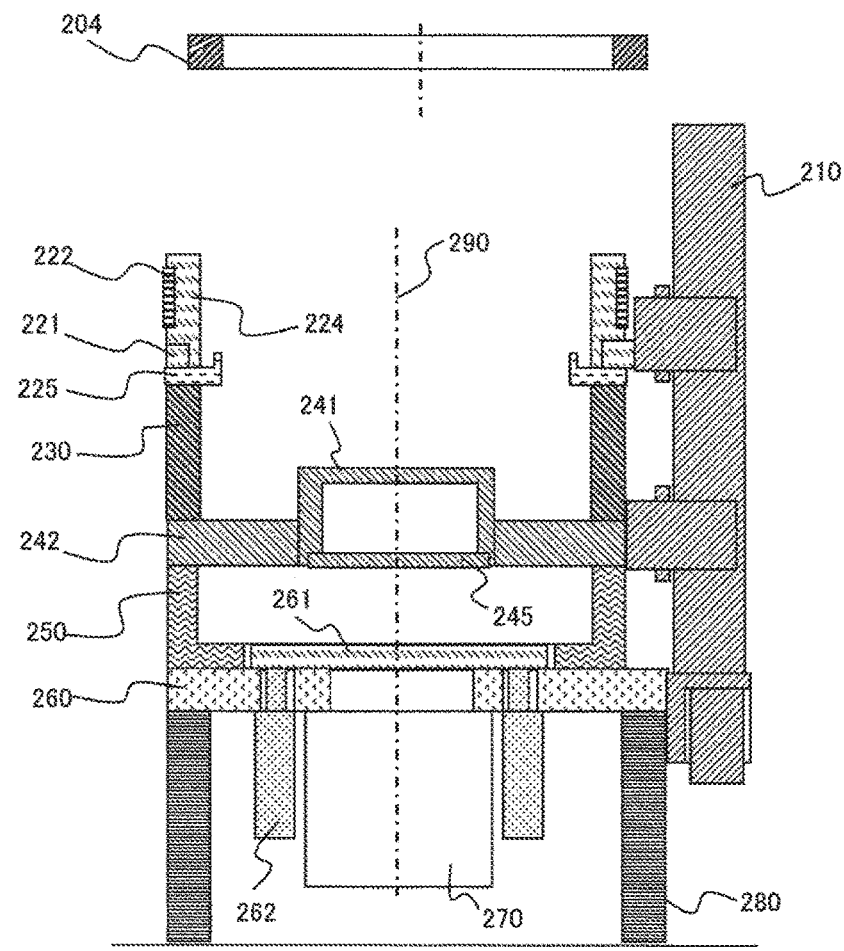

In addition, the sample stage 241 and a support beam portion of the sample stage base 242 are exposed in the vacuum processing chamber. Subsequently, as illustrated in FIGS. 7A and 7B, the gas introduction ring 204 is moved upward and removed.

Figure 8A:
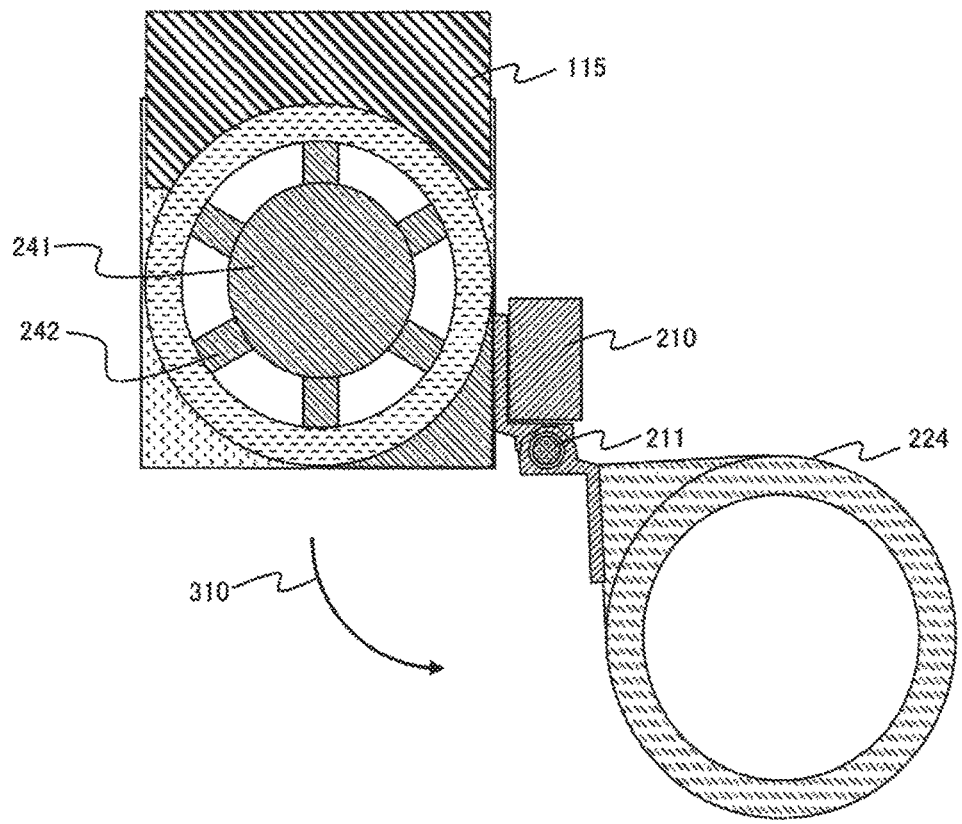
FIGS. 8A and 8B are a top view and a longitudinal sectional view for description of the procedure of maintenance in the vacuum processing chamber of the vacuum processing apparatus according to the embodiment of the invention illustrated in FIGS. 1A and 1B.
Figure 8B:
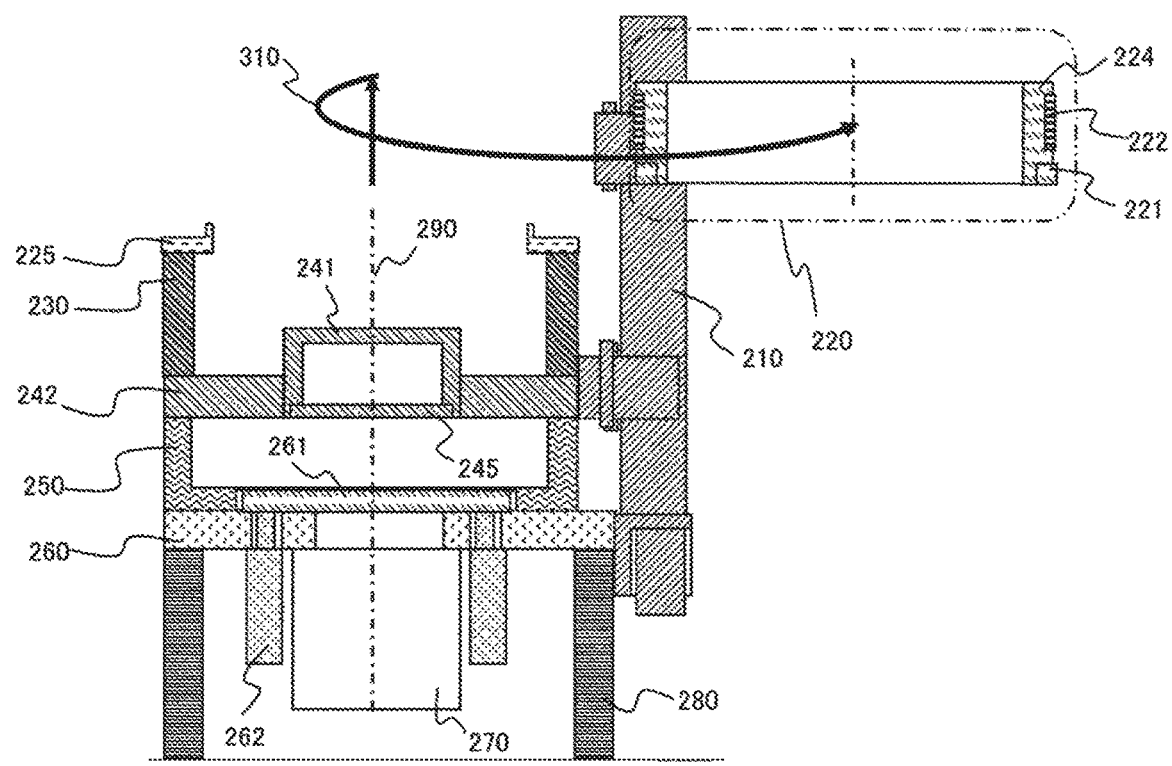

Subsequently, as illustrated in FIGS. 8A and 8B, a discharge block unit 220 including the discharge block base 221 fixed to a movable portion of the turning lifter 210, and the discharge block 224 and the heater 222 mounted above the discharge block base 221 moves to an outside of a region of the vacuum processing chamber when viewed from above in the vertical direction by moving upward around a pivot 211 and then horizontally turning in a counterclockwise direction as indicated by an arrow 310. In the present embodiment, the discharge block unit turns in the counterclockwise direction. However, it is possible to adopt a configuration in which the discharge block unit turns in a clockwise direction by changing a position of the turning lifter to an opposite side (right side arrangement in the figure to left side arrangement).

A distance in which the discharge block unit 220 moves upward is set to be greater than or equal to a height beyond a protrusion of the earth ring 225. In the present embodiment, the distance is set to 5 cm. However, the distance is not restricted thereto.

When a height of the protrusion of the earth ring is low, a height (several cm) in which the O-ring 207 is separated from the discharge block unit 220 or the earth ring 225 or more is adopted. In addition, even though a turning angle is set to 180°, the turning angle may be set to 90° or more and 270° or less.

However, 180°±20° is preferable considering workability. When a discharge-related member, which is not subjected to regular maintenance, turns together as the discharge block unit 220, the discharge-related member and the discharge block unit 220 may be allowed to rapidly and easily avoid an upper part of the vacuum processing chamber. When the discharge block unit 220 is allowed to avoid the upper part of the vacuum processing chamber, the earth ring 225 is exposed at the upper end of the vacuum processing chamber.

Figure 9A:
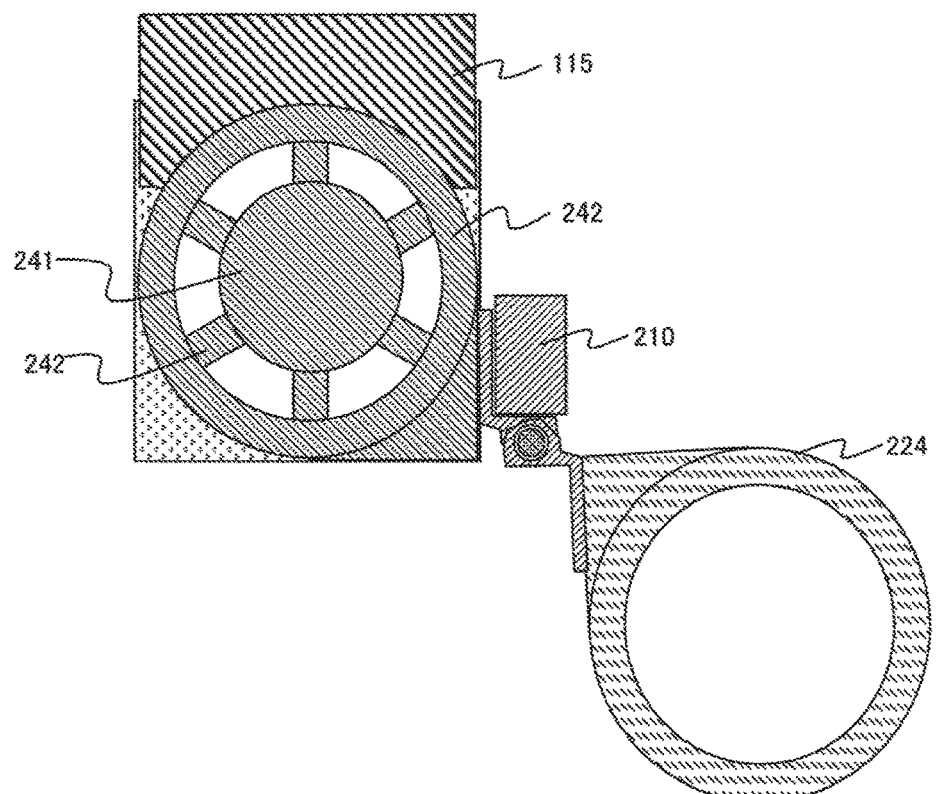
FIGS. 9A and 9B are a top view and a longitudinal sectional view for description of the procedure of maintenance in the vacuum processing chamber of the vacuum processing apparatus according to the embodiment of the invention illustrated in FIGS. 1A and 1B.
Figure 9B:
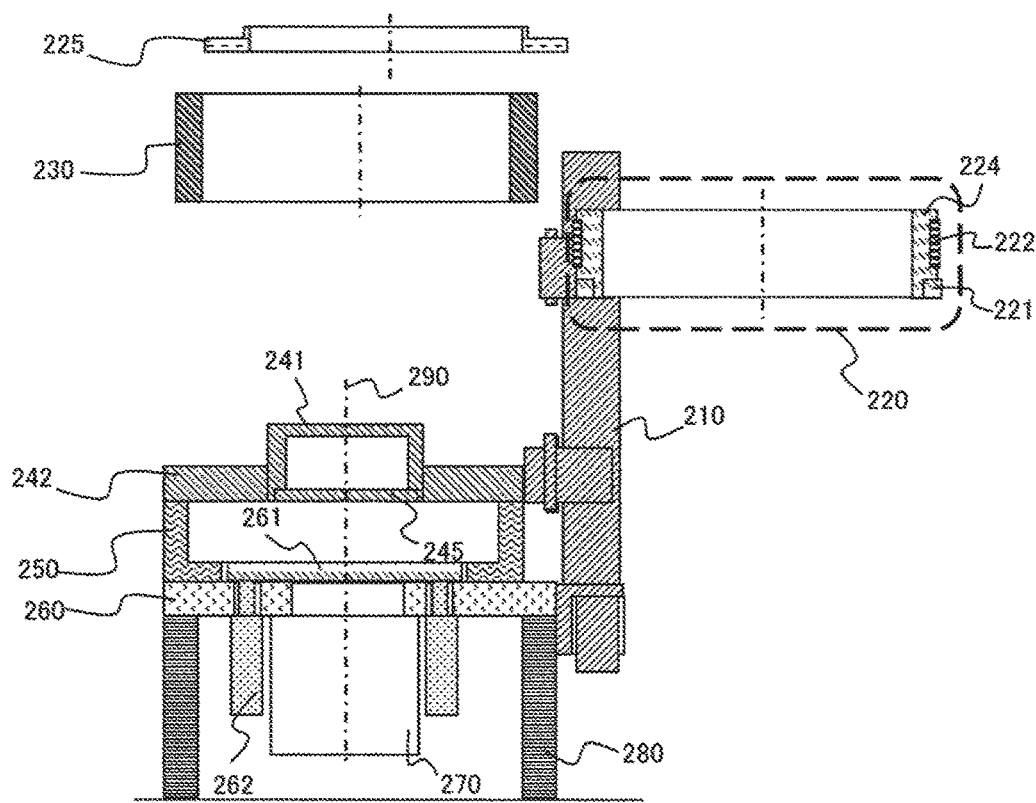

Subsequently, as illustrated in FIGS. 9A and 9B, the earth ring 225 and the upper container 230 corresponding to a main member subjected to regular maintenance are moved upward and removed. In other words, the upper container 230 may be easily removed in a swappable (exchangeable) state.

In the present embodiment, the vacuum partition wall (upper container) included in the vacuum processing chamber is replaceable. In this way, it is possible to suppress a maintenance time of the upper container 230 after disassembling the vacuum processing chamber as much as possible.

At the time of performing maintenance, the first gate valve is closed, and the second gate valve is open. When the first gate valve 111 is closed to put the vacuum conveyance chamber 104 in a vacuum-sealed state, processing in another vacuum processing chamber is allowed, and it is possible to suppress a decrease in operation rate of the vacuum processing apparatus as much as possible.

Meanwhile, when the second gate value 112 is in an open state, the upper container 230 and the valve box 115 may be separated from each other. The upper container 230 is removed after removing a screw that fixes the upper container 230 and the base plate 260 in the flange portion.

The discharge block unit is moved by the control device that controls the turning lifter. This control device may be dedicated to the turning lifter, and may be incorporated as a part of the control device of the entire vacuum processing apparatus. When the upper container 230 is removed, in addition to the sample stage 241 and the support beam, a ring portion of the sample stage base 242 is exposed.

Figure 10A:
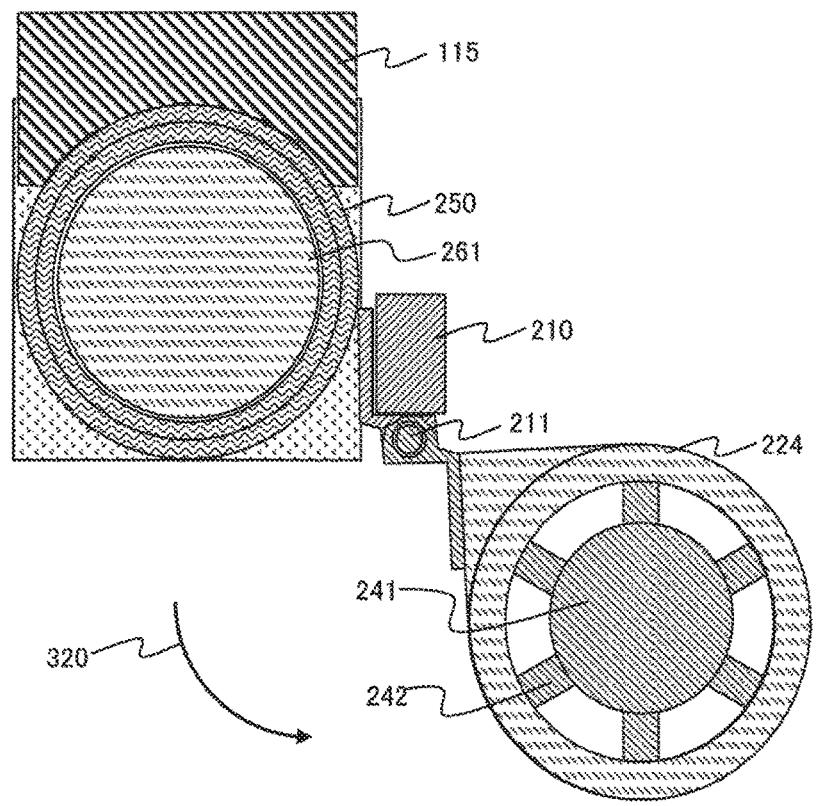
FIGS. 10A and 10B are a top view and a longitudinal sectional view for description of the procedure of maintenance in the vacuum processing chamber of the vacuum processing apparatus according to the embodiment of the invention illustrated in FIGS. 1A and 1B.
Figure 10B:
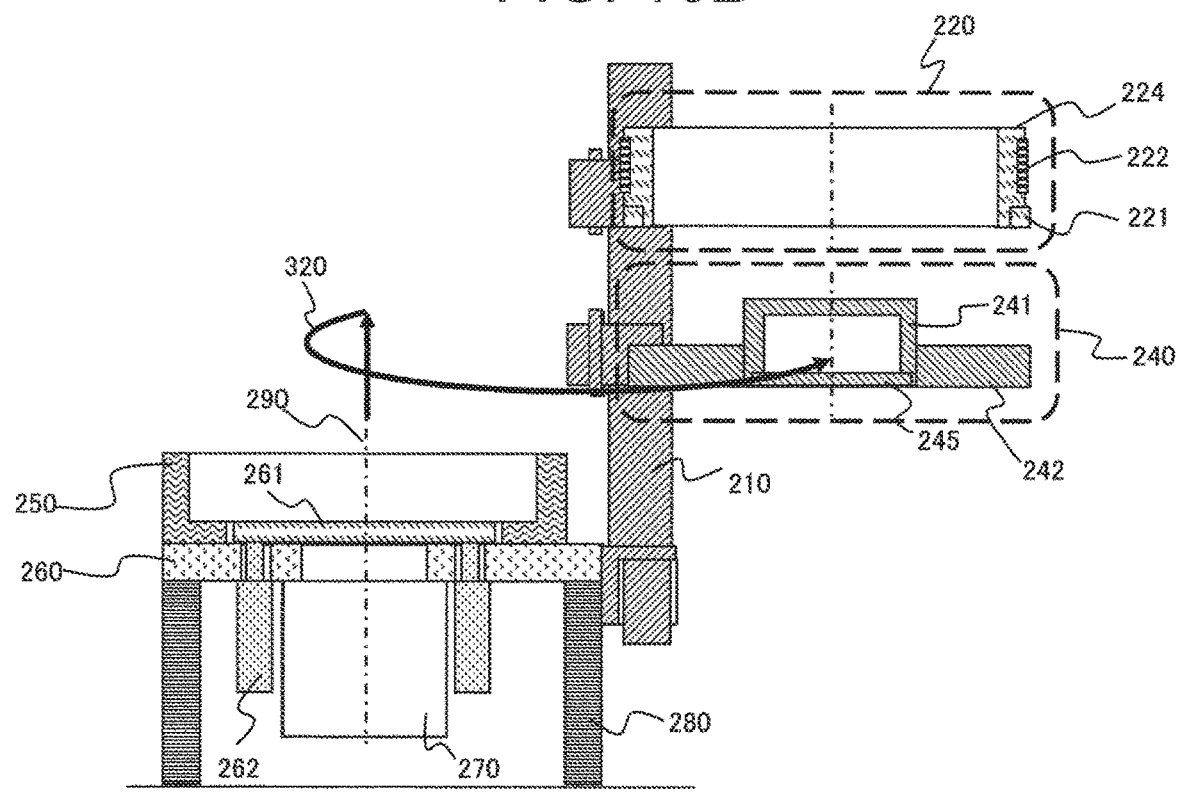

Subsequently, as illustrated in FIGS. 10A and 10B, a sample stage unit 240 including the sample stage base 242 fixed to the movable portion of the turning lifter 210, and the sample stage 241 and the sample stage bottom lid 245 mounted above the sample stage base 242 moves to an outside of a region of the vacuum processing chamber when viewed from above in the vertical direction by moving upward around the pivot 211 and then horizontally turning in the counterclockwise direction as indicated by an arrow 320. In the present embodiment, the sample stage unit turns in the counterclockwise direction. However, it is possible to adopt a configuration in which the sample stage unit turns in a clockwise direction by changing a position of the turning lifter to an opposite side (right side arrangement in the figure to left side arrangement).

A distance in which the sample stage unit 240 moves upward is set to be greater than or equal to a height in which the O-ring 207 peels off from the sample stage unit 240 or the lower container 250. In the present embodiment, the distance is set to 2 cm. However, the distance is not restricted thereto.

Further, it is desirable that a turning angle is set to the same value as that of the discharge block unit 220. In this way, a total area of both the discharge block unit 220 and the sample stage unit 240 may be reduced when viewed from above in the vertical direction.

When a sample stage-related member, which is not subjected to regular maintenance, turns together as the sample stage unit 240, the sample stage-related member and the sample stage unit 240 may be allowed to rapidly and easily avoid the upper part of the vacuum processing chamber. The sample stage unit 240 is moved by the control device that controls the turning lifter.

This control device may be dedicated to the turning lifter, and may be incorporated as a part of the control device of the entire vacuum processing apparatus. When the sample stage unit 240 is allowed to avoid the upper part of the vacuum processing chamber, the lower container 250 is exposed at the upper end of the vacuum processing chamber. In addition, the entire surface of the exhaust portion lid 261 is exposed.

Figure 11A:
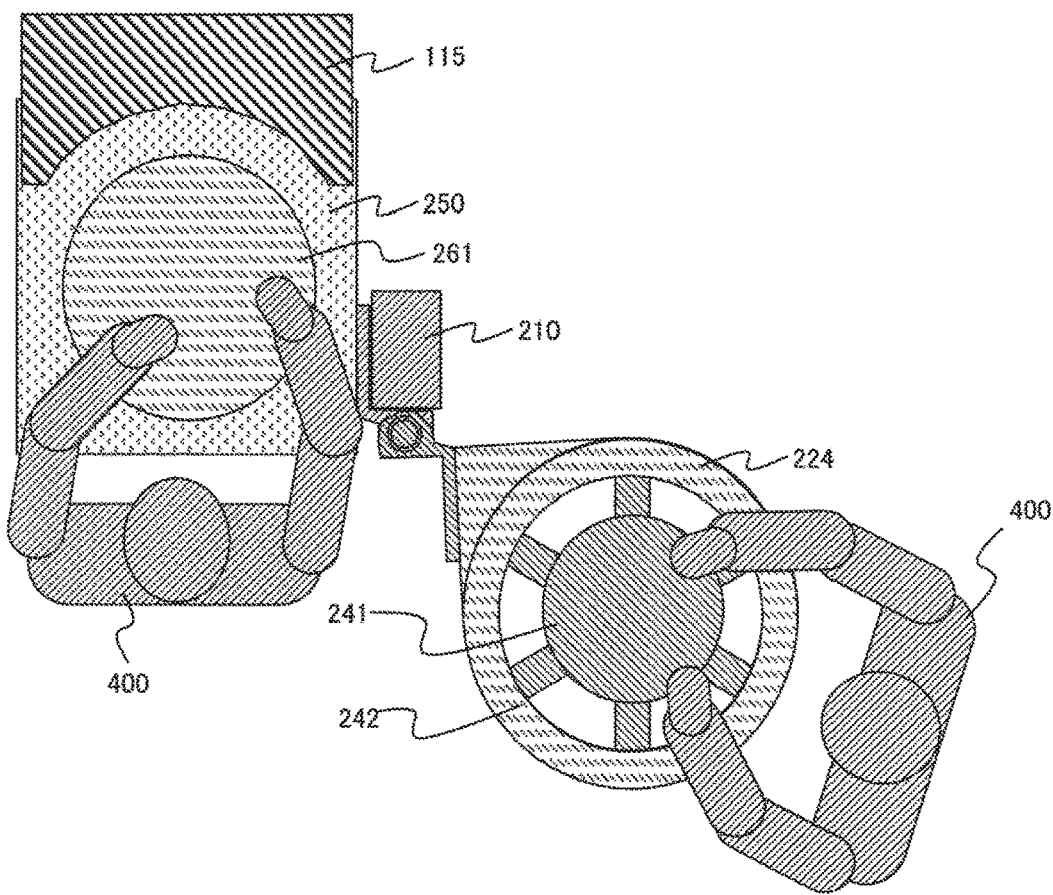
FIGS. 11A and 11B are a top view and a longitudinal sectional view for description of the procedure of maintenance in the vacuum processing chamber of the vacuum processing apparatus according to the embodiment of the invention illustrated in FIGS. 1A and 1B.
Figure 11B:
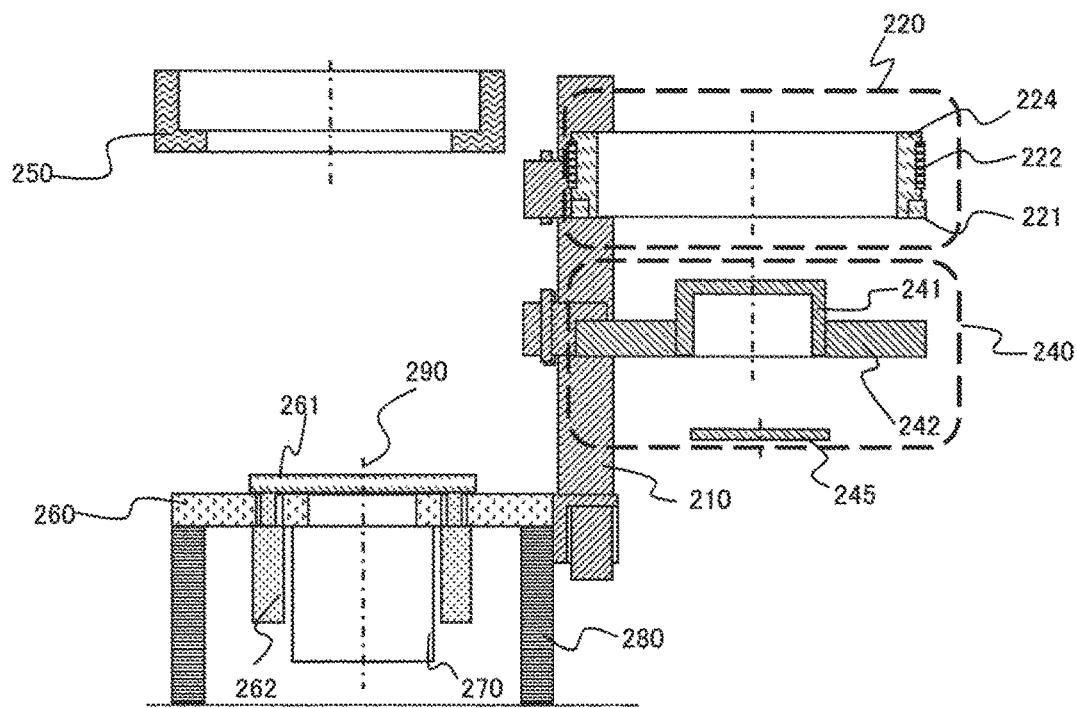

Subsequently, after removing a screw that fixes the lower container 250 and the base plate 260 in the flange portion, the lower container 250 corresponding to a main member subjected to regular maintenance is moved upward and removed as illustrated in FIGS. 11A and 11B.

In other words, the lower container 250 may be easily removed in a swappable (exchangeable) state. In this way, it is possible to suppress a maintenance time of the lower container 250 after disassembling the vacuum processing chamber as much as possible.

After the lower container 250 is removed, inspection/maintenance of a surface of the base plate 260 or the surface of the exhaust portion lid 261 is performed. Normally, since an exposed portion of the base plate 260 is covered with the lower container 250, adhesion of the reaction product is small.

In addition, an upper surface of the exhaust portion lid 261 is disposed under the sample stage when the workpiece is processed, and may be cleaned as necessary even though adhesion of the reaction product is small. Since a wall, etc. (obstacle in maintenance) included in the vacuum processing chamber is not provided around the base plate 260 and the part is flat, it is possible to improve work efficiency of maintenance by an operator 400 (not illustrated in FIG. 10B).

After performing cleaning, inspection/maintenance, replacement (in particular, the upper container and the lower container) of the members to be subjected to regular maintenance, the members are assembled in reverse order to the above description and are subjected to vacuum processing.

Next, a procedure of irregular maintenance will be described. A member subjected to irregular maintenance mainly corresponds to a member included in the discharge block unit 220 and a member included in the sample stage unit 240.

In the case of the member included in the discharge block unit 220, after the discharge block unit 220 is lifted upward and rotated in the horizontal direction as illustrated in FIGS. 8A and 8B, it is possible to perform maintenance such as inspection/replacement of the heater 222, inspection and cleaning of an inner wall of the discharge block 224, etc. in a desired direction. Since the discharge block unit 220 avoids a member included in another vacuum processing chamber, it is possible to improve working efficiency.

In the case of the member included in the sample stage unit 240, after the sample stage unit is lifted upward and rotated in the horizontal direction as illustrated in FIGS. 10A and 10B, it is possible to perform maintenance of various power cords, a sensor wire, a temperature adjustment component, etc. from a desired direction by removing the sample stage bottom lid as illustrated in FIG. 11B. At least one of a wiring cord used to electrostatically adsorb the workpiece on the sample stage, a wiring cord used to apply a high frequency bias to the sample stage, a wiring cord used to control a temperature of the sample stage, or a wiring cord used to detect temperatures of the refrigerant pipe and the sample stage is disposed in the cavity inside the support beam, and these wiring cords are subjected to irregular maintenance.

When the discharge block unit 220 is an obstacle to work, it is possible to rotate a region in which the vacuum processing chamber is disposed when viewed from above in the vertical direction or a part around the region in the clockwise direction. In this way, it is possible to improve work efficiency of the sample stage unit 240. Further, when the turning angles of the discharge block unit and the sample stage unit are appropriately shifted, maintenance of the both units may be performed at the same time, thereby improving work efficiency.

In the present embodiment, the discharge block unit and the sample stage unit are rotated in the horizontal direction after being lifted upward. However, it is possible to adopt a configuration in which the discharge block unit and the sample stage unit are linearly extracted in the horizontal direction after being lifted. In this way, it is possible to minimize a movement range. In addition, a configuration of a moving mechanism is simplified. However, rotating in the horizontal direction is advantageous in ensuring a work space of maintenance.

In addition, in the present embodiment, not only the upper container but also the lower container is replaced. However, it is possible to adopt a configuration in which a liner (cover) is attached to cover an inner surface of the lower container, and the liner is replaced.

In addition, in the present embodiment, one turning lifter is provided, and the discharge block unit and the sample stage unit are rotated in the same direction. However, when an operation region can be ensured, two turning lifters may be provided, and the respective turning lifters may be rotated in different directions. When a turning lifter for the discharge block unit and a turning lifter for the sample stage unit are provided, heights of the respective units may be freely set. In addition, since more operations may be disposed, simultaneous progress of work may be easily performed, the work may be finished in a short time, and work efficiency is improved.

In addition, in the present embodiment, a component other than the discharge block unit or the sample stage unit moved using the turning lifter is manually moved. However, it is possible to use a hoist such as a crane.

Figure 12A:
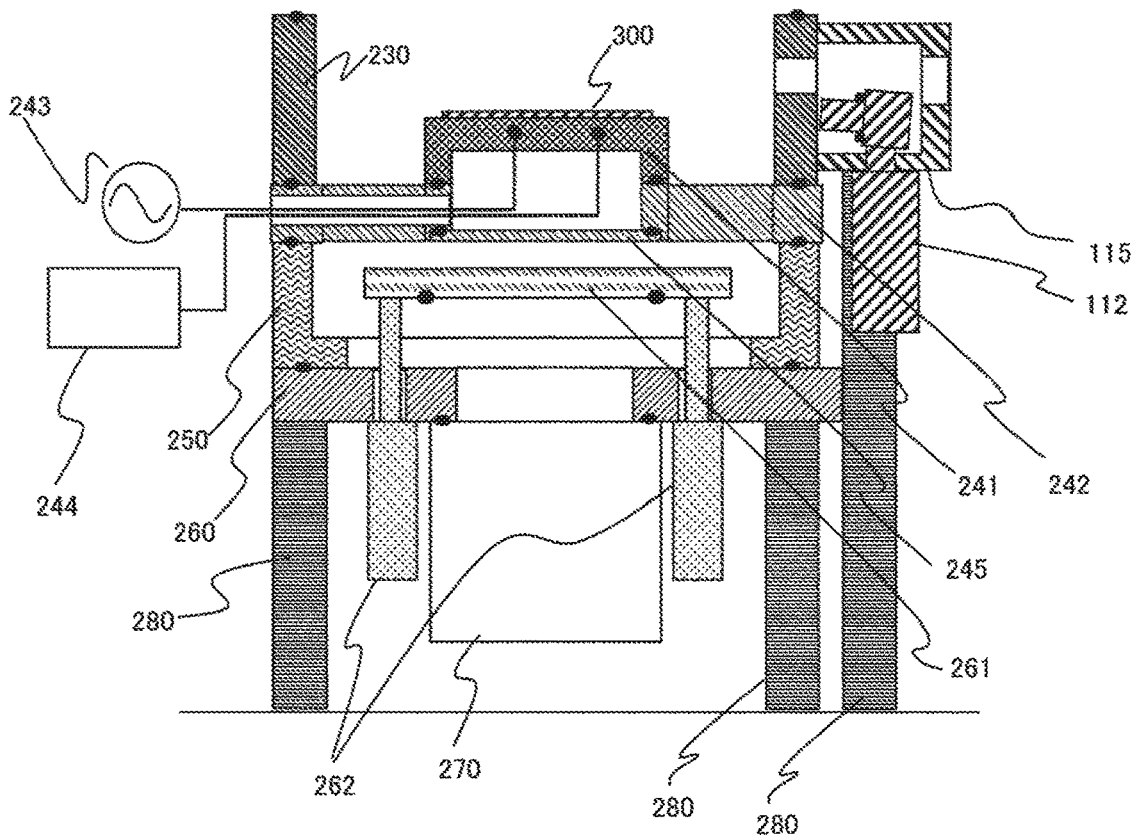
FIGS. 12A and 12B are longitudinal sectional views schematically illustrating an outline of the configuration of the vacuum processing chamber according to the embodiment illustrated in FIG. 3.
Figure 12B:
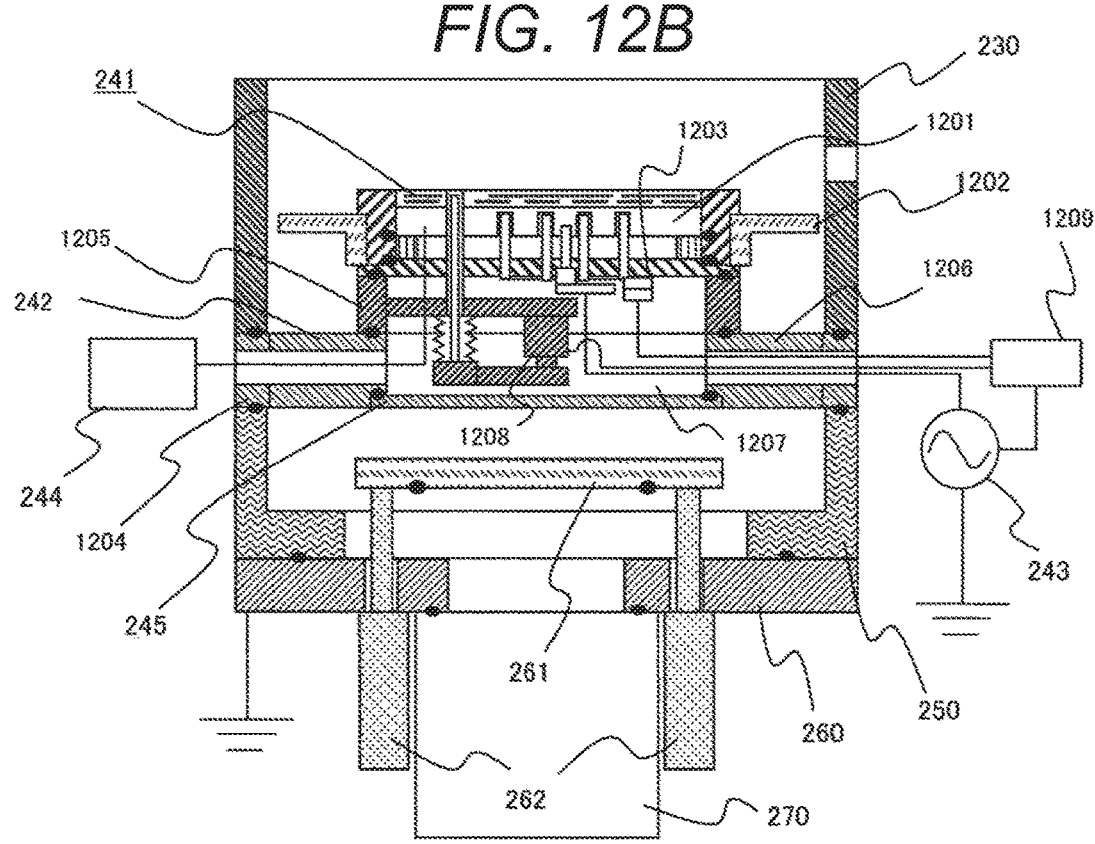

Next, the configuration of the vacuum processing chamber according to the present embodiment will be described in more detail with reference to FIGS. 12A and 12B to FIG. 15. FIGS. 12A and 12B are longitudinal sectional views schematically illustrating an outline of the configuration of the vacuum processing chamber according to the embodiment illustrated in FIG. 3.

In particular, FIG. 12A is a longitudinal sectional view illustrating a lower portion of one of the vacuum processing chambers 200-1 to 200-4 illustrated in FIG. 3 or FIG. 4 by enlarging the lower portion. Further, members such as the first high frequency power supply 201, the lid member 202, the coil 206, etc. disposed above the vacuum processing chambers 200-1 to 200-4 are omitted. That is, a lower portion of one of the vacuum processing chambers 200-1 to 200-4 illustrated in FIG. 3 or FIG. 4 from the upper container 230 is enlarged and illustrated.

One of the vacuum processing chambers 200-1 to 200-4 illustrated in FIG. 3 or FIG. 4 is referred to as a vacuum processing chamber 2001 in description of FIGS. 12A and 12B to FIG. 15 below. The vacuum processing chamber 2001 illustrated in this figure is roughly divided into a vacuum vessel, a base disposed below the vacuum vessel to support the vacuum vessel from below, and exhaust means which is connected below the base and communicates with an inside of the vacuum vessel to exhaust the inside.

In the present figures, a description of a portion to which reference numeral illustrated in a figure such as FIG. 3 described above is assigned is omitted unless the description is necessary. Further, the present figures illustrate the second gate valve 112 which is disposed on a side wall of the vacuum vessel and comes into contact with the side wall around a gate corresponding to an opening that communicates between an inside and an outside of the vacuum vessel to close and airtightly seal the gate or open the gate, and the box 115 including the second gate valve 112 therein.

As in the embodiment of FIGS. 3 and 4, the vacuum vessel of the vacuum processing chamber 2001 of the present figures includes the upper container 230, the sample stage base 242 below the upper container 230, and the lower container 250 disposed below the sample stage base 242. Further, the upper container 230, the sample stage base 242, and the lower container 250 are placed to form a layer in the vertical direction. A lower surface of the lower container 250 is placed on an upper surface of the base plate 260 in contact therewith.

Further, the vacuum processing chamber 2001 includes a plurality of support columns 280 that supports the base plate 260 and the vacuum vessel above the base plate 260 by upper end portions thereof connected to the base plate 260 below a lower surface of the base plate 260 corresponding to the base and above a floor surface of a building in which the vacuum processing chamber 2001 is installed therebetween. The vacuum processing chamber 2001 further includes the exhaust pump 270 disposed below a through-hole to communicate with an exhaust port for exhaust on the inside disposed in a central portion of the base plate 260 in a space between the lower surface of the base plate 260 and the floor surface formed by the base plate 260 supported by the support column 280, and the cylinder 262 serving as an actuator that vertically drives the exhaust portion lid 261, which is disposed inside the lower container 250 to open or airtightly close the exhaust port, with respect to the exhaust port.

In the vacuum processing chamber 2001, the base plate 260 is electrically connected to a ground electrode and set to a ground potential. For this reason, the lower container 250, the lower surface of which comes into contact with and is connected to the base plate 260, the sample stage base 242, and the upper container 230 are set to the ground potential.

The exhaust means includes the exhaust pump 270 such as the turbo molecular pump disposed below the lower container 250 and the exhaust portion corresponding to a through-hole formed in the base plate 260 to communicate therewith, and an exhaust duct (not illustrated) that connects an inlet of the exhaust pump 270 and the exhaust port to each other to allow communication therebetween. In the vacuum processing chamber 2001 of the present figure, an outlet of the exhaust pump 270 is connected to a roughing vacuum pump such as a rotary pump which is disposed in advance in a building where the vacuum processing chamber 2001 is grounded. In addition, a flow rate or speed of exhaust gas discharged from the exhaust port is adjusted when the exhaust portion lid 261 increases or decreases an area of an exhaust flow path to the exhaust port by the cylinder 262 driven to vertically move with respect to the exhaust port.

FIG. 12B is a longitudinal sectional view schematically illustrating an enlarged configuration of a main part including the sample stage base 242 illustrated in FIG. 12A. In particular, a configuration of the sample stage 241, which is disposed in the processing chamber inside the vacuum vessel including the upper container 230 connected to the sample stage base 242, the sample stage base 242, and the lower container 250 to hold the wafer 300 placed on the upper surface thereof, is more specifically enlarged and illustrated.

Similarly to FIG. 12A, in the vacuum processing chamber 2001 illustrated in the present figure, the vacuum vessel, the base plate 260 disposed below the vacuum vessel, and the exhaust means disposed below the base plate 260 are disposed in the vertical direction. Further, the vacuum vessel is configured by connecting the upper container 230, the sample stage base 242, and the lower container 250, each of which has a cylindrical inner side wall surface, in the vertical direction, and disposing the upper container 230, the sample stage base 242, and the lower container 250 at positions at which central axes thereof in the vertical direction correspond to one another in the horizontal direction or the central axes approximate to one another to the extent that allows the central axes to be regarded as corresponding to one another.

The sample stage block is roughly divided into the sample stage base 242 included in a lower part, the sample stage 241 which is placed on and connected to the sample stage base 242 and has a cylindrical head portion 1201, and an outer periphery ring 1202 disposed in a ring shape above the sample stage base 242 and at an outer peripheral side of the sample stage 241 to surround the sample stage 241. In the present embodiment, these portions are configured to be detachable from the vacuum vessel or a lower part and replaceable in a state in which the inside of the vacuum vessel is at an atmospheric pressure and open in an operation in which maintenance such as replacement, inspection, etc. of a component is performed in the vacuum processing chamber 2001.

The head portion 1201 included in an upper part of the sample stage 241 includes a base plate 1203 which is a plate-shaped member made of metal having a circular shape, a base material which is placed on the base plate 1203, has a disc or cylindrical shape, and is made of metal, and a film made of a dielectric disposed to cover a circular upper surface of the base material. The base plate 1203 and the base material having the film made of the dielectric are connected to each other and detachably formed integrally as described below.

The sample stage base 242 is a member that functions as a base on which the sample stage 241 is placed, and includes a cylindrical base cylinder, a T flange 1205 placed on and connected to a central portion of the base cylinder and connected to an outer peripheral lower surface of the base plate 1203 with the head portion 1201 placed thereon, and a storage space 1207 corresponding to a space inside the base cylinder and the T flange 1205. As described below, the storage space 1207 is set to an atmospheric pressure or the same pressure as that inside a building where the vacuum processing chamber 2001 is grounded in a space in which a pin driver 1208 vertically moving a plurality of pins raising and lowering the wafer 300 above the head portion 1201, a connector to a sensor or an electrode connected to the head portion 1201, etc. are disposed therein.

The base cylinder includes a ring-shaped base ring 1204 which is included in an outermost peripheral portion and whose upper and lower portions are sandwiched between the upper container 230 and the lower container 250 to form the vacuum vessel, a cylindrical central cylinder disposed on a center side of the base ring 1204, and a plurality of support beams 1206 integrally formed by connecting therebetween. In the present embodiment, an inner periphery of the base ring 1204 and an outer periphery of the central cylinder have cylindrical shapes which have different radii and are disposed at horizontal positions at which centers thereof in the vertical direction correspond to each other or the centers approximate to each other to the extent that allows the centers to be regarded as corresponding to each other. Further, the support beams 1206 are disposed such that axes thereof are radially disposed along a radial direction from a position of a central axis, and angles between axes of adjacent support beams are equal or approximate to each other to the extent that allows the angles to be regarded as corresponding to each other.

A lower surface of the central cylinder is configured such that a sample stage bottom lid 245 may be attached and detached, and the sample stage bottom lid 245 is attached to airtightly seal and close the storage space 1207 on the inside with respect to the central cylinder. The storage space 1207 includes a tubular space which is disposed to penetrate the inside of the central cylinder inside the respective support beams 1206 and the base ring 1204 and to the outside of the vacuum processing chamber 2001 so as to communicate therewith.

The T flange 1205 has a cylindrical outer peripheral portion and a space forming the storage space 1207 inside, and the pin driver 1208 is disposed in the space. Referring to the cylindrical outer peripheral portion, an upper end portion thereof faces or comes into contact with an outer periphery edge portion lower surface of the base plate 1203 above the cylindrical outer peripheral portion, and a lower end portion thereof faces or comes into contact with a central cylinder upper end portion of the base cylinder below the cylindrical outer peripheral portion with a seal member such as the O-ring interposed therebetween.

In addition to the pin driver 1208, a pipe of refrigerant to be supplied to the head portion 1201, a sensor, or a wire such as a feeder cable to an electrode is disposed inside the storage space 1207 in the sample stage base 242. Further, a passage in the support beam 1206 included in the storage space 1207 serves as a space in which a pipe or a cable connecting between the sample stage 241 and a power source or a refrigerant supply source disposed outside the vacuum processing chamber 2001.

A plurality of temperature sensors, which is inserted into a plurality of recessed portions disposed inside the base material to detect a temperature of the base material, has an end portion disposed inside the storage space 1207, and the end portion is connected to the base ring 1204 or a vessel controller 1209 disposed outside the vacuum processing chamber 2001 by a cable through a space inside the support beam 1206 such that communication is allowed, thereby allowing an output of each temperature sensor transmitted during processing of the wafer 300 to be received by the vessel controller 1209. In addition, similarly, the pin driver 1208 is connected to the vessel controller 1209 by a cable such that communication is allowed, and an operation of the pin driver 1208 is adjusted according to a command signal from the vessel controller 1209.

In addition, high frequency power having a frequency smaller than a frequency of an electric field for forming plasma is supplied to the metallic base material during the processing of the wafer 300, and a bias potential is formed on the wafer 300 placed on an upper surface of the dielectric film. In the present embodiment, a connector for receiving high frequency power for forming a bias potential from the second high frequency power supply 243 is inserted into the base material and electrically connected thereto and attached to the head portion 1201. Further, a power supply cable that electrically connects between an end portion of the connector disposed inside the storage space 1207 and the second high frequency power supply 243 is disposed in the storage space 1207 including a space inside a specific support beam 1206.

Further, a refrigerant flow path through which refrigerant whose temperature is adjusted to a value within a predetermined range is supplied and circulated is disposed in the metallic base material. Such refrigerant is adjusted in temperature by the second temperature controller 244 including a temperature controller using a refrigeration cycle such as a chiller and supplied to the refrigerant flow path inside the base material by an internal pump, and the refrigerant discharged after heat exchange is returned to the second temperature controller 244 and adjusted in temperature again, and then supplied to the refrigerant flow path inside the base material again. A refrigerant pipe connecting the refrigerant flow path and the second temperature controller 244 is disposed in the storage space 1207 including a space of the support beams 1206.

The vessel controller 1209 includes operational equipment, is disposed outside the vacuum processing chamber 2001 or the vacuum vessel, and is connected to the sample stage 241 and a plurality of devices such as the pin driver 1208 disposed inside the storage space, etc. such that communication is allowed. The vessel controller 1209 receives a signal from a device connected such that communication is allowed, detects information contained in the signal, and transmits a command signal to the device to adjust an operation thereof.

The vessel controller 1209 of the present embodiment includes an arithmetic unit including a semiconductor device, an interface for exchanging a signal with a device, and a storage device such as a memory device such as a random access memory (RAM) or a read only memory (ROM), a hard disk drive, etc. which stores data therein to record or store the data, and these devices are connected in the vessel controller 1209 such that communication is allowed. The vessel controller 1209 receiving a signal from the outside through the interface detects information from the signal using the arithmetic unit, stores the information in the storage device, reads software stored in the storage device in advance, calculates a command signal corresponding to the previous signal according to an algorithm described therein, and transmits the command signal to a device to be controlled through the interface.

The storage device of the vessel controller 1209 may be housed inside the vessel controller 1209 or may be disposed outside the vessel controller 1209 such that communication is allowed. The vessel controller 1209 of the present embodiment is connected to the temperature sensor and the pin driver 1208 such that communication is allowed.

Figure 13A:
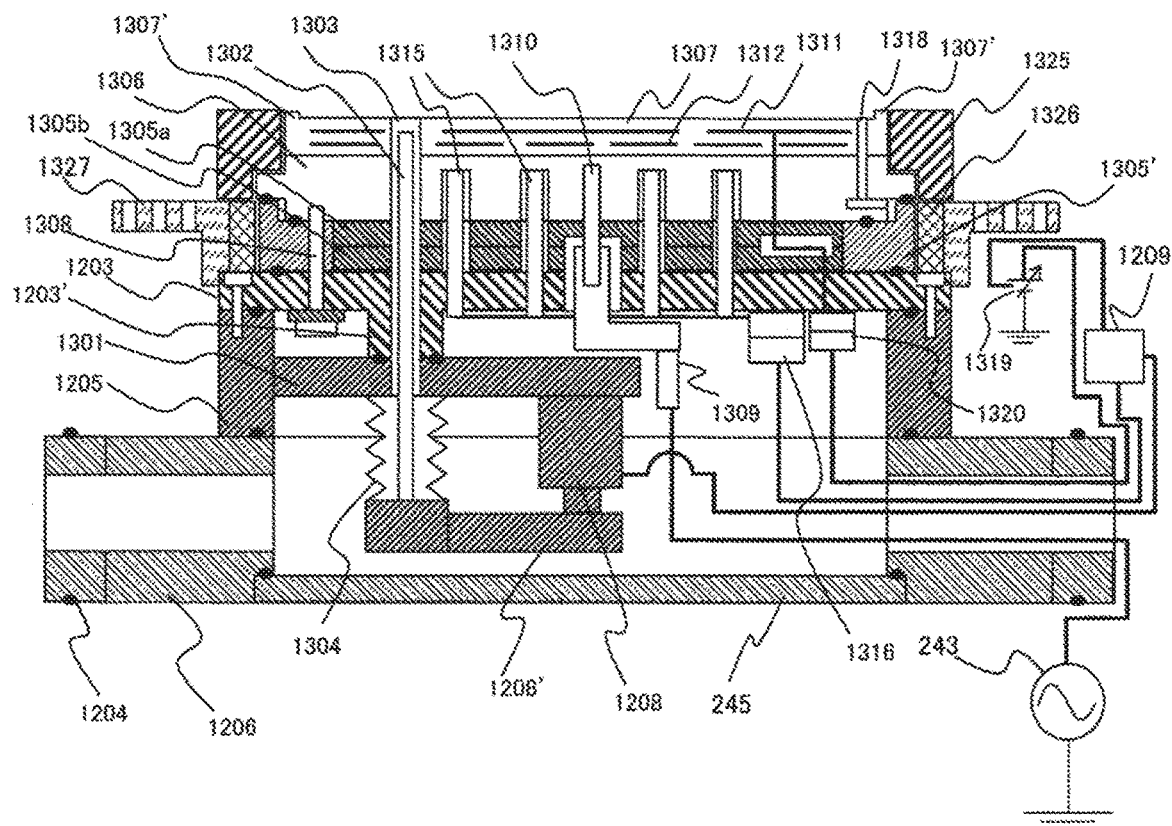
FIGS. 13A and 13B are longitudinal sectional views schematically illustrating an enlarged configuration of a sample stage of the vacuum processing chamber according to the embodiment illustrated in FIGS. 12A and 12B.
Figure 13B:
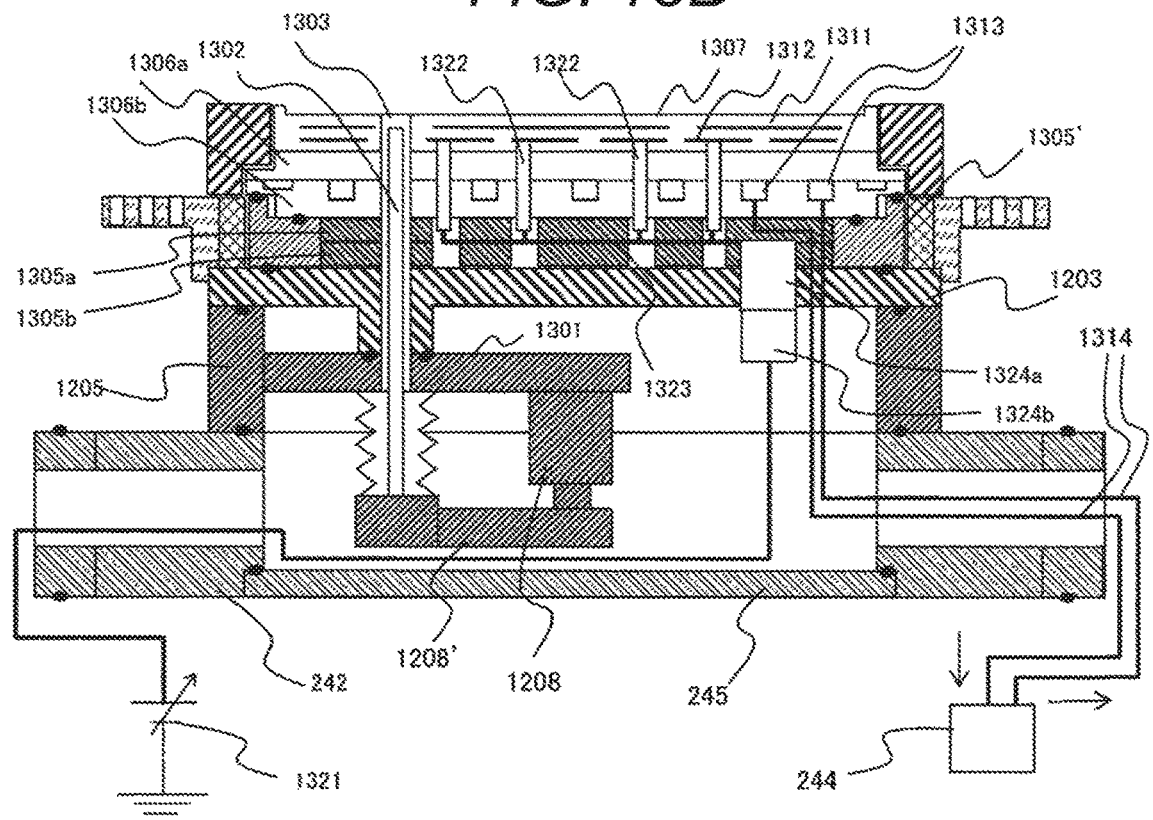

A configuration of a main part of the sample stage block of FIG. 12B will be enlarged and described in more detail. FIGS. 13A and 13B are longitudinal sectional views schematically illustrating an enlarged configuration of the sample stage of the vacuum processing chamber according to the embodiment illustrated in FIGS. 12A and 12B. In this example, FIGS. 13A and 13B are diagrams illustrating cross sections of the sample stage 241 and the sample stage base 242 taken in different directions with vertical planes passing through central axes thereof.

The sample stage block illustrated in FIG. 13A includes the sample stage 241, the sample stage base 242, and the outer periphery ring 1202. As illustrated in FIGS. 10A and 10B, the sample stage block is configured such that the sample stage base 242 is movable from above the lower container 250 on a lower side integrally with the sample stage 241 by rotating around a vertical axis of the turning lifter 210 after a portion above the sample stage base 242 including the upper container 230 of the vacuum processing chamber 2001 is removed from the sample stage base 242.

As illustrated in FIGS. 13A and 13B, the sample stage block is configured such that the sample stage 241 having the base plate 1203 on a lower face thereof is placed on the sample stage base 242, and the sample stage 241 and the sample stage base 242 are detachably connected through fastening means such as a bolt. In this state, the outer periphery ring 1202 made of metal is disposed above an upper surface of an outer periphery edge of the base plate 1203 on the outer peripheral side of the sample stage 241.

The sample stage base 242 includes the base cylinder having the outer periphery ring 1202, the support beams 1206, and the central cylinder, and the T flange 1205 disposed to come into contact with or face the base cylinder with the seal member such as the O-ring interposed therebetween above the base cylinder. Further, the sample stage base 242 includes the storage space 1207 in which the base cylinder and the T flange 1205 are connected to each other and disposed therein.

The T flange 1205 has a cylindrical portion which has a cylindrical shape as described above and is included in an outer peripheral side wall inside the vacuum processing chamber 2001 of the sample stage base 242, and a T-shaped or Y-shaped beam portion 1301 disposed in the storage space 1207 inside the cylindrical portion and integrally connected to or formed on an inner periphery wall having the cylindrical shape of the cylindrical portion. Further, an upper end portion of the cylindrical portion is disposed on the base plate 1203 of the head portion 1201 of the sample stage 241 and a lower end portion thereof is disposed on the central cylinder of the base cylinder through the O-ring so that the storage space 1207 is airtightly sealed with respect to the vacuum processing chamber 2001.

In addition, in the T-shaped or Y-shaped beam portion 1301, these end portions are integrally connected to or formed on an inner periphery wall surface of the cylindrical portion and disposed inside the cylindrical portion, and a space included in the storage space 1207 is formed between a plurality of beams extending from a center of the beam portion 1301 to the inner periphery wall surface of the cylindrical portion. The space between the beams is a path in which the sensor, a wire such as a cable of the connector, or a pipe of refrigerant or gas connected to the inside of the head portion 1201 through the base plate 1203 is disposed to pass therethrough.

The beam portion 1301 is a plate-shaped member including each beam, a distal end portion of each beam is integrally connected to or formed at an intermediate position of upper and lower ends in a height direction of the inner periphery wall surface having the cylindrical shape of the cylindrical portion, a space is formed between the upper surface of the beam portion 1301 and the lower surface of the base plate 1203 above the beam portion 1301 in a state in which the base plate 1203 is placed above the T flange 1205 and the inside is sealed, and this space between the beam portion 1301 and the base plate 1203 is used as a space in which the connector or the sensor is disposed. Further, as described above, the upper end portion of the pin driver 1208 is connected to the lower surface of the central portion of the beam portion 1301, and a hole through which a plurality of pins 1302 (three in the present embodiment) penetrates is disposed in each beam. Here, the pins are connected to the lower end portion of the pin driver 1208 to move in the vertical direction according to movement of the pin driver 1208 that vertically extends and contracts.

These pins 1302 penetrate the head portion 1201 including the base plate 1203 at an upper side and are inserted into a through-hole 1303 communicating with the opening disposed on the dielectric film included in an upper surface of the head portion 1201 to perform a vertically releasing, approaching, and placing operation of the wafer 300 placed above the dielectric film with respect to the upper surface of the head portion 1201 or the sample stage 241 by movement in the vertical direction. For this reason, a space on the outer peripheral side of the pins 1302 located inside the storage space 1207 communicates with the vacuum processing chamber 2001, and the seal member such as the O-ring is disposed around a pin through-hole of the beam portion to airtightly seal a part from a space communicating with an inside of the vacuum processing chamber 2001 on the outer peripheral side of the pin 1302 between the pin and the storage space 1207 above and below the pin through-hole of the beam portion.

That is, in a lower part of the base plate 1203, protrusions 1203', which have a cylindrical shape or a truncated cone shape protruding downward from the lower surface of the surrounding base plate 1203 and in which through-holes 1303 storing the respective pins 1302 penetrating therethrough therein are disposed at central portions, are disposed at a plurality of positions (three positions in the present embodiment). In a state in which the base plate 1203 and the T flange 1205 are vertically connected to each other, a lower end surface of each protrusion 1203' and an upper surface of an outer periphery of the pin through-hole disposed in each beam of the beam portion 1301 come into contact with each other or face each other to interpose the seal-member such as the O-ring therebetween, and a part between an inner space of the pin through-hole of each beam and the through-hole 1303 inside the head portion 1201 and the storage space 1207 on the outside is airtightly sealed.

Each pin 1302 is connected to an upper surface of a distal end portion of three arms connected to the lower end portion of the pin driver 1208 by a vertical extension and contraction operation of the pin driver 1208 whose upper end portion is connected to the lower surface of the central portion of the beam portion 1301 inside the storage space 1207, and extends from the upper surface of the distal end portion of each arm up to the inside of the through-hole 1303 in the head portion 1201. An upper distal end of each pin is located at a maximum height above the upper surface of the sample stage 241 in a state in which the pin driver 1208 contracts as much as possible, and is located inside the through-hole 1303 in the head portion 1201 in a state in which the pin driver 1208 extends as much as possible.

A bellows 1304, which contracts according to vertical movement of the arm and the pin 1302 by connecting between the lower surface of each beam and the upper surface of each arm to which each pin 1302 is connected, is disposed in an outer periphery of each pin 1302 located below each beam of the beam portion 1301. Upper and lower ends of the bellows 1304 connected to the lower surface of each beam and the upper surface of each arm are connected by coming into contact with each other or facing each other with the seal member such as the O-ring interposed between the lower surface of the beam and the upper surface of the arm, and a part between an inside of the bellows 1304, which communicates with the inside of the vacuum processing chamber 2001 through the through-hole 1303 storing each pin 1302 therein and the through-hole of the beam of the beam portion 1301, and the storage space 1207 on the outside is airtightly sealed.

According to such a configuration, the pin 1302 moves in the vertical direction according to extension and contraction of the pin driver 1208 driven by the command signal from the vessel controller 1209 between a maximum and a minimum, and the bellows 1304 extends and contracts. With regard to movement of the pin 1302 and an extension/contraction operation of the bellows 1304, a part between an inside of the bellows and the through-hole 1303 and the storage space 1207 is airtightly sealed. For this reason, even during operation of the vacuum processing chamber 2001 for processing the wafer 300, plasma formed in the vacuum processing chamber 2001, a particle having reactivity of the processing gas, or a particle of the reaction product is inhibited from adversely affecting the pin driver 1208, the sensor, or a terminal such as the connector disposed inside the storage space 1207.

The head portion 1201 included in the sample stage 241 of the present embodiment includes the base plate 1203, an insulating member 1305 placed on the base plate 1203, a metallic base material 1306 placed above the base plate 1203. Further, a dielectric film 1307 containing ceramics such as yttria or alumina included in the placement surface on which the wafer 300 is placed is disposed on an upper surface having a circular shape of the base material 1306 which has a disc or cylindrical shape. In addition, the sealing member such as the O-ring is sandwiched between and integrally connected to the base plate 1203, the insulating member 1305, and the base material 1306, the inside of the vacuum processing chamber 2001 and a space inside the sample stage block communicating with the storage space 1207 are airtightly sealed, and the head portion 1201 is attached to the sample stage base 242 as a group of members and is detachable upward.

That is, the base plate 1203 has a disk shape, and is fastened to the base material 1306 thereon through the insulating member 1305 placed thereon by a metallic bolt 1308 inserted from below the base plate 1203 through a through-hole disposed in an outer periphery-side portion. In this way, the base plate 1203, the insulating member 1305, and the base material 1306 are integrally connected to one another.

Further, a diameter of the disk-shaped base plate 1203 is larger than that of the insulating member 1305 and the base material 1306 which are disposed on the upper side and whose outer periphery has a disk or a cylindrical shape, and the base plate 1203 is fastened to the upper end portion of the cylindrical portion of the T flange 1205 whose upper end portion faces or comes into contact with the lower surface of the outer periphery edge portion of the base plate 1203 with the O-ring interposed therebetween below the lower surface using a bolt on the outer peripheral side of the insulating member 1305. In this way, upward removal from the T flange 1205 or the sample stage base 242 with the head portion 1201 in an integrated manner is allowed by releasing fastening of the bolt on the outer peripheral side.

As illustrated in FIG. 13B, the base material 1306 is a member in which an upper surface and a lower surface of two disc-shaped or cylindrical metallic base materials corresponding to an upper base material 1306a and a lower base material 1306b come into contact with each other and are integrated with each other by being joined together using means such as brazing or friction stirring, and a refrigerant flow path 1313 is disposed inside the lower base material 1306b. Further, a power receiving connector 1310 to which high frequency power from the second high frequency power supply 243 is supplied is inserted into a recessed portion formed to have an opening at a lower side in the figure at a central portion inside the upper base material 1306a and connected to the base material 1306.

A lower portion of the power receiving connector 1310 is in contact with a power supply connector 1309 connected to a distal end portion of the power supply cable and electrically connected thereto. With acceleration of a process by a charged particle in plasma attracted to the upper surface of the wafer 300 to collide therewith according to a difference between a bias potential and a plasma potential formed above the upper surface of the wafer 300 placed on the head portion 1201 or the placement surface thereof by the high frequency power supply supplied from the second high frequency power supply 243 to the base material 1306, the wafer 300 and the base material at a lower side are heated.

In the present embodiment, in order to adjust the temperature of the wafer 300 and the base material 1306 or the head portion 1201, which changes upon heating, to a value within a desired range suitable for processing, refrigerant brought to a predetermined temperature in the second temperature controller 244 is supplied to the refrigerant flow path 1313 inside the base material 1306 and circulates, and a gas having a heat transfer property such as He is supplied between the upper surface of the dielectric film 1307 on the base material 1306 and the back surface of the wafer 300 placed on the dielectric film 1307 and adsorbed and held thereon. In the present embodiment, the sample stage 241 includes a gas flow path 1317 which is disposed in a ring shape on the outer peripheral side of the base material 1306 and through which heat transferable gas flows, and a gas supply path 1318 serving as a through-path that communicates with a gap among the gas flow path 1317, the wafer 300, and the dielectric film 1307 to communicate with an opening disposed on the upper surface of the dielectric film 1307 included in the placement surface on the base material 1306.

Gas having a heat transfer property is supplied from the gas supply path 1318 through the opening to a gap from the upper surface of the dielectric film 1307, and is supplied to the wafer 300, the base material 1306, and the refrigerant flow path 1313. Further, heat transfer to and from circulating refrigerant is promoted, and the amount thereof increases. The temperature of the upper surface of the wafer 300 or the base material 1306 can be adjusted according to a value of the temperature of the refrigerant, a flow rate or a speed thereof, a pressure value in a gap of the heat transfer gas and a distribution thereof.

As described above, the metallic base material 1306 is supplied with the refrigerant having a relatively large heat capacity compared to the wafer 300 and a temperature within a predetermined range from the second temperature controller 244. The base material 1306 functions as an electrode to which high frequency power for forming a bias potential above the wafer 300 is supplied as a base of a temperature value of the wafer 300 placed on the upper side and subject to temperature adjustment.

As described above, the upper base material 1306*a*, which is a metallic disc-shaped or cylindrical member, has a recessed portion in which the outer periphery-side portion thereof surrounds the center side and is disposed in a ring shape, and a center side portion surrounded by the recessed portion is a cylindrical portion having a shape protruding upward from the bottom surface of the recessed portion. A circular upper surface of a convex portion of the upper base material 1306*a* is covered with the dielectric film 1307 and the upper surface of the dielectric film 1307 is used as the placement surface of the wafer 300.

The placement surface having a circular shape on the upper surface of the convex portion has the same or similar diameter as the wafer 300. Further, in a state in which the wafer 300 is placed on the placement surface during and before the processing, an electrostatic force is formed between the wafer 300 and the dielectric film 1307 by power supplied to a plurality of places inside the dielectric film 1307 after the value is adjusted from a plurality of DC power supplies and absorbed and held on the upper surface of the dielectric film 1307 or heat is generated by the supplied DC power, and the temperature value of the wafer 300 or a distribution thereof is adjusted.

That is, the dielectric film 1307 is formed using ceramics containing yttria or alumina as a material. In the present embodiment, particles of the material are blown in a semi-molten state in a region of a larger upper surface including the entire region to be the placement surface of the upper base material 1306*a* by the thermal spraying method, so that a film is formed. A plurality of film-shaped electrostatic adsorption (ESC) electrodes 1311 to which DC power for forming an electrostatic force for adsorbing the wafer 300 is supplied, and a plurality of film-shaped heater electrodes 1312 used as heaters for heating and adjusting the temperature of the wafer 300 to a value within a desired range suitable for processing are disposed inside the dielectric film 1307.

The ESC electrodes 1311 are a plurality of film-shaped electrodes arranged in a region below a projection plane of the placement surface of the dielectric film 1307 covered by the ESC electrode 1311 with the wafer 300 placed thereon.

The ESC electrodes 1311 of this embodiment are formed by the thermal spraying method similarly to the dielectric film 1307.

Two of the plurality of ESC electrodes 1311 are connected to different DC power supplies 1319 and potentials with different polarities are applied to the respective ESC electrodes 1311 so that an electric charge is polarized and accumulated in the wafer 300 with the material of the ceramics contained in the dielectric film 1307 interposed therebetween and an electrostatic force attracting and holding the wafer 300 in the direction of the dielectric film 1307 is formed. Further, even after plasma disappears due to polarity opposite to that during the processing applied to the ESC electrodes 1311 after processing of the wafer 300, polarization of a stored charge is relaxed or removed in the container to form an electrostatic force that attracts the wafer 300 before or during processing.

Each of the ESC electrodes 1311 is electrically connected to an upper portion of an ESC electrode feeder cable connector unit 1320 attached to the lower surface of the base plate 1203 through a feed path extending through the base plate 1203, the insulating member 1305, and the base material 1306. Furthermore, a lower portion of the ESC electrode feeder cable connector unit 1320 connected to the upper portion of the ESC electrode feeder cable connector unit 1320, to which the plurality of ESC electrodes is electrically connected, below the upper portion is electrically connected to one of the DC power supplies 1319 which is arranged outside the vacuum processing chamber 2001 and assigned to supply DC power to the plurality of ESC electrodes 1311 through one feeder cable disposed in the storage space 1207.

The DC power supplies 1319 are configured to be capable of variably adjusting the magnitude of a current or a voltage to be output and are connected to the vessel controller 1209 such that communication is allowed. A signal indicating the value of the current or the voltage is transmitted from the DC power supply 1319 to the vessel controller 1209. From the DC power supply 1319 receiving the command signal calculated and transmitted by the vessel controller 1209 using the arithmetic unit, DC power whose voltage or current magnitude is adjusted by the DC power supply 1319 based on the command signal is supplied to the plurality of ESC electrodes 1311 connected thereto through the feeder cable outside the sample stage 241 and the plurality of feed paths inside the sample stage 241.

The heater electrodes 1312 are a plurality of film-shaped electrodes made of metal disposed in a position below the inside of the dielectric film 1307 in the height direction, each of which is formed by the thermal spraying method similarly to the dielectric film 1307 has a fan shape or an arc shape. The respective heater electrodes 1312 are electrically connected through each of a plurality of heater power supply connectors 1322 arranged at the lower side thereof and at least one heater power supply connector unit 1323, and DC power whose current or voltage is adjusted to a desired value is supplied in the DC power supply 1321, and the amount of generated heat is adjusted.

As illustrated in FIG. 13B, the heater power supply connectors 1322 electrically connected to the respective heater electrodes 1312 under the heater electrodes 1312 have a lower end portion exposed in the storage space 1207 from below the lower surface of the lower base material 1306*b* by penetrating the lower portion of the dielectric film 1307 below the heater electrodes 1312 and the base material 1306 below the lower portion. The lower end portion of the heater power supply connector 1322 is electrically connected to the heater power supply connector unit 1323 located below the lower base material 1306*b* by penetrating the base plate 1203 through a connection cable 1322' electrically connected to a connection terminal through the inside of an insulating member.

In addition, the heater power supply connector 1322 includes a metal connection terminal electrically connected to the connection cable 1322' and included in the feed path, and an insulating boss made of a dielectric material disposed on the outer peripheral side thereof to insulate the connection terminal from the base material 1306 on the inside of the heater power supply connector 1322. Each of the heater power supply connectors 1322 is inserted into an insertion hole disposed in the base material 1306 from below and attached to the base material 1306.

In this state, the connection terminal of the heater power supply connector 1322 inside the insertion hole is electrically connected to the heater electrode 1312 and comes into contact with the connection terminal on the heater side extending downward from above the insertion hole on the inside of the insulating box of the heater power supply connector 1322, or one is fit into the other one and both upper and lower connection terminals are connected. The lower end portion of the heater power supply connector 1322 is connected to a feed path inside an insulator and the upper portion of the heater power supply connector unit 1323 attached to the base plate 1203 through the connection cable 1322' in a space inside the insulating member 1305 between the base plate 1203 and the base material 1306.

As will be described later, a gap or a space on the center side of the insulating member 1305 and the base material 1306 is a space which communicates with the storage space 1207 and constitutes a part thereof, and the inside and the outside are airtightly sealed by a sealing member such as an O-ring surrounding the spaces on the outer peripheral side. For this reason, similarly to the storage space 1207, a connecting portion of the connector and the cable on the feed path arranged in the above-mentioned space has a pressure set to an atmospheric pressure or a pressure having a value approximate to a degree that may be regarded as the atmospheric pressure regardless of the operation of the vacuum processing chamber 2001.

The heater power supply connector unit 1323 is a connector having a terminal for connected and disconnected on the feed path attached to the base plate 1203, and has two upper and lower portions.

A heater power supply connector unit upper portion 1323*a* is connected to a connection cable 1323' of the plurality of heater power supply connectors 1322 at place between the upper surface of the base plate 1203 and the lower surface of the base material 1306. A heater power supply connector unit lower portion 1323*b* is connected to the feeder able connected to the DC power supply 1321 for the heater in the storage space below the lower surface of the base plate 1203.

The heater power supply connector unit upper portion 1323*a* and the heater power supply connector unit lower portion 1323*b* are detachably configured, and the connection terminals electrically connected to the cables provided inside the respective portions are connected and the DC power supply 1321 and the plurality of heater power supply connectors 1322 are electrically connected in a state in which both the portions are integrally connected. As a result, the DC power output from the DC power supply 1321 is supplied in parallel to the plurality of heater power supply connectors 1322 and the plurality of heater electrodes 1312 electrically connected to the respective heater power supply connectors 1322.

In this way, the dielectric film 1307 incorporating the ESC electrode 1311 and the heater electrode 1312 is formed by spraying the respective materials by the thermal spraying method and stacking the materials. First, in order to facilitate adhesion of the materials in advance, coating of a lower layer of the dielectric film 1307 is formed by the thermal spraying method using particles made of ceramics as the material on the upper surface of the upper base material 1306*a* on which irregularities are formed, and a film of the heater electrode 1312 is formed thereon.

After an intermediate layer of the dielectric film 1307 is formed by the thermal spraying method over the coating of the lower layer and an upper surface of the film of the heater electrode 1312 using ceramics as a material, the ESC electrode 1311 is formed on the intermediate layer by the thermal spraying method. Thereafter, a film of the upper layer of the dielectric film 1307 is formed using the thermal spraying method to cover the intermediate layer and a film layer of the ESC electrode 1311.

Referring to the dielectric film 1307 stacked by the thermal spraying method, at least a surface constituting the placement surface is scraped off so that a hole between particles on the surface formed by thermal spraying is blocked and a shape is adjusted. In a state in which the wafer 300 is placed on the upper surface of the dielectric film 1307 constituting the placement surface and adsorbed by the electrostatic force, a fluid such as a gas having a heat transfer property such as He is supplied to a gap formed between the back surface of the wafer 300 and the upper surface of the placement surface to promote heat transfer between the wafer 300 and the sample stage 241. The shape of the surface is adjusted such that a desired amount of heat transfer is obtained between the wafer 300 and the dielectric film 1307 constituting the placement surface in a contact area therebetween.

As illustrated in FIG. 13A, the metallic power receiving connector 1310 is inserted into and brought into contact with the metallic base material 1306, and high frequency power from the second high frequency power supply 243 is supplied to the base material 1306 serving as an electrode through the power supply connector 1309 and the power receiving connector 1310 coming into contact therewith by passing through the cable in which the storage space 1207 is disposed during processing of the wafer 300 on which plasma is formed in the vacuum processing chamber 2001. In a state in which the wafer 300 is placed on the placement surface of the sample stage 241 and electrostatically attracted and held by supply of high frequency power, a bias potential that attracts charged particles in the plasma to the upper surface of the wafer 300 and collides the particles with the film layer to be processed on the surface to promote processing such as etching, etc. is formed according to a potential difference from a potential of plasma above the wafer 300.

Multiple grooves arranged concentrically or spirally around a center and formed in a radial direction are disposed on the upper portion of the lower base material 1306*b* having a disc shape or a cylindrical shape, and the refrigerant flow path 1313 is formed inside the base material 1306 by being joined to the upper base material 1306*a*. An inlet and an outlet of the refrigerant flow path 1313 are connected to a pipe 1314 for supplying or returning refrigerant connected to the second temperature controller 244 through a connector for connection disposed below the base plate 1203 on the inside of the storage space 1207.

Refrigerant heated to a temperature within a predetermined range using a refrigeration cycle of the chiller, etc. of the second temperature controller 244 is supplied into the refrigerant flow path 1313 through the inlet by passing through the pipe 1314. After the refrigerant whose temperature has increased by heat exchange inside the base material 1306 is returned to the second temperature controller 244 through the outlet of the refrigerant flow path 1313 and the pipe 1314 connected thereto, the temperature is adjusted to a value within a predetermined range again, and then the refrigerant is supplied to the refrigerant flow path 1313 inside the base material 1306 and circulates in a closed loop. The base material 1306 is adjusted to a value within a desired range suitable for processing by a sequential supply of the refrigerant.

In the present embodiment, a plurality of gas supply paths 1318 arranged to penetrate the dielectric film 1307 included in the placement surface of the wafer 300 by covering the cylindrical protrusion on the upper portion of the base material 1306 and the circular upper surface of the protrusion, and openings disposed at a plurality of places on the outer peripheral side of the placement surface on the upper surface of the dielectric film 1307 communicating therewith are provided. A ring protrusion 1307' coming into contact with the back surface of the wafer 300 is disposed at an outer periphery edge portion of the dielectric film 1307 covering an outer periphery edge of the placement surface of the upper base material 1306a while the wafer 300, which is disposed in a ring shape by surrounding a central side of the upper surface and whose flat upper surface is placed on the placement surface of the dielectric film 1307, is absorbed. The plurality of openings is arranged along the ring protrusion 1307' on a recessed surface of the placement surface on the center side thereof.

The wafer 300 is supplied from the opening to a gap between the wafer 300 and the dielectric film 1307 inside the recessed portion corresponding to a circular region on the central side of the ring protrusion 1307' in a placed state, and gas having the heat transfer property is closed by the ring protrusion 1307' at an end portion on the outer peripheral side of the region or leaks out from the vacuum processing chamber 2001 outside the sample stage 241 by an extremely small amount. A fluctuation (distribution) of the amount of heat transfer in an in-plane direction of the wafer 300 is reduced by filling the inside of the recessed portion, and the amount of heat transfer or the temperature of the wafer 300 may be brought closer to a desired value in a circumferential region around the outer periphery edge of the wafer 300.

The insulating member 1305 is a member made of a dielectric material, and is interposed between the metallic base material 1306 fastened in the vertical direction by the bolt 1308 and the metallic base plate 1203 to insulate therebetween and between a portion and a temperature sensor 1315 attached to the base plate 1203 and inserted into the base material 1306 through the base plate 1203 as illustrated in FIG. 13A. Further, a sealing member such as an O-ring is sandwiched, deformed, and held between the insulating member 1305 and the base plate 1203 and the base material 1306. A part between a space such as a gap inside the insulating member 1305 and the base material 1306 above the base plate 1203 communicating with the storage space 1207 and the inside of the vacuum processing chamber 2001 on the outside is airtightly sealed.

The insulating member 1305 of the present embodiment roughly includes two members. In more detail, the insulating member 1305 includes an insulating ring 1305' which is disposed on the outer peripheral side and has a ring shape and whose outer peripheral side wall has a cylindrical shape is made of ceramics such as alumina as a material, and two upper and lower insulating plates 1305a and 1305b which are disposed in a region surrounded by the center of the insulating ring 1305' and made of an elastic resin such as polytetrafluoroethylene, and a gap is disposed therebetween.

Upper and lower end portions of the insulating ring 1305' on the outer peripheral side have smooth surfaces due to fastening of the base material 1306 and the base plate 1203 using the bolt 1308, and a sealing member such as an O-ring is sandwiched between the smooth surface and outer peripheral side surfaces of the base material 1306 and the base plate 1203 on upper and lower sides. In this way, a space inside the insulating ring 1305' and a space of a gap communication with the storage space 1207 on the inside of the base material 1306 and the base plate 1203 fastened in the vertical direction with the insulating ring 1305' interposed therebetween using the bolt 1308 are airtightly sealed from the outside.

Further, the insulating ring 1305' is made of ceramics such as alumina having a relatively high rigidity and inhibited from being deformed, and positions of both the fastened ones may be regarded as being fixed. Since the deformation of the insulating ring 1305' is relatively small, a variation in distance in the vertical direction between the base material 1306 and the base plate 1203 from this state is reduced to be smaller than or equal to a desired value due to fastening of the base material 1306 and the base plate 1203 using the bolt 1308. Thus, the temperature sensor 1315 or the base plate 1203 is inhibited from coming into contact with or electrically connected to the base material 1306 to impair insulation therebetween. Further, equipment such as a pipe, a cable, or a sensor attached to the base plate 1203 or the base material 1306 is less likely to be shifted or damaged by receiving an external force, and performance of detection is less likely to vary with a change in shape and dimensions of each member included in the head portion 1201 resulting from an increase or decrease in temperature in the fastening operation or processing of the wafer 300 on the sample stage 241 after the fastening.

The insulating ring 1305' is a ring-shaped member constituting a part on the outer peripheral side of the head portion 1201 and the insulating member 1305, and is held by being interposed between the base material 1306 on the upper side and the base plate 1203 on the lower side. An upper part thereof has a ring-shaped protrusion surrounding a central side by protruding upward in an outer periphery-side portion and a flat upper surface in a portion in which a height of the ring-shaped protrusion on the inner periphery (central) side in the vertical direction is lower than the protrusion.

Further, in a region on the outer peripheral side of the lower part of the lower base material 1306b constituting the lower part of the base material 1306, the thickness in the vertical direction is made small, and the recessed portion dented upward as viewed from the lower surface of the lower base material 1306 is arranged in a ring shape by surrounding the central side portion. In a state in which the insulating ring 1307' is sandwiched and held between the base plate 1203 and the base material 1306, the ring-shaped protrusion of the insulating ring 1307' is engaged with the recessed portion on the outer peripheral side of the lower base material 1306b and is inserted into the recessed portion. The flat upper surface of the protrusion and the flat upper surface of the protrusion on the inner peripheral side are connected to the base material 1306 on the upper side or face the base material 1306 through a gap with a seal member such as an O-ring interposed therebetween, and the flat lower surface is connected to the upper surface of the base plate 1203 on the lower side or face the upper side through a gap with a seal member such as an O-ring interposed therebetween.

Further, the insulating ring 1305' has a through-hole through which the bolt 1308 for fastening the base material 1306 and the base plate 1203 using the bolt 1308 vertically penetrates by having an opening in an upper surface of the ring-shaped protrusion on the inner peripheral side, the bolt 1308 is inserted into the inside from below the through-hole of the base plate 1203, penetrates the through-hole of the insulating ring 1305' disposed in alignment with the axial direction on the upper side, and is inserted and screwed into a female threaded hole of the base material 1306 on the upper side, and the base material 1306 and the base plate 1203 on the lower side are connected and fastened with the insulating ring 1305' and an O-ring therebetween interposed therebetween.

In the present embodiment, in a state in which the protrusion on the upper part of the insulating ring 1305' is fitted into the recessed portion on the outer peripheral side of the lower base material 1306b, and the protrusion and the recessed portion are brought into contact with each other with the O-ring interposed therebetween or surfaces are connected by facing each other through a gap, a position in the radial direction of the inner peripheral side wall surface of the ring-shaped protrusion of the insulating ring 1305' from the central axis of the sample stage 241 or the head portion 1201 in the vertical direction is larger than that of the outer peripheral side wall surface of the lower base material 1306b, and a gap having a predetermined length (width) in the radial direction is formed in a ring shape around the center therebetween. This ring-shaped gap is airtightly connected to a connector to a pipe connected to a gas source (not illustrated) through a through-hole for piping of the base plate 1203, and serves as the gas flow path 1317 that circulates the portion on the outer peripheral side inside the head portion 1201 in a ring shape by being supplied with a gas having high heat conductivity such as He.

The gas such as He supplied to the gas flow path 1317 diffuses in the circumferential direction of the head portion 1201 inside the gas flow path 1317, and is introduced to the outer periphery-side portion of the placement surface from each of the plurality of gas supply paths 1318 disposed at equal angles around the central axis of the sample stage 241. A heat transferable gas is supplied to a plurality of portions on the outer peripheral side of the back surface of the wafer 300 at the same flow rate or speed so that a variation in the circumferential direction of the amount of heat transfer between the wafer 300 via the dielectric film 1307 and the base material 1306 or the refrigerant inside the refrigerant flow path 1313 therein, and a variation in the temperature of the wafer 300 are reduced.

Two upper and lower insulating plates 1305a and 1305b arranged in a region on the center side of the head portion 1201 are members made of resin having relatively lower rigidity as compared with the insulating ring 1305'. In the present embodiment, a plurality of through-holes, in which a plurality of temperature sensors 1315 inserted into the base material 1306 by penetrating the base plate 1203 from a lower side in the figure is disposed, is disposed in each of the insulating plates 1305a and 1305b. Further, a through-hole, in which the power receiving connector 1310 inserted into the base material 1306 by penetrating the base plate 1203 is disposed, is disposed at central portions of the insulating plates 1305a and 1305b.

The power receiving connector 1310 and the respective temperature sensors 1315 are inserted upward in the figure from a lower side of the base material 1306 in the figure, and lower end portions thereof are attached to the base plate 1203 and locations thereof are fixed in a state in which the base material 1306 is fastened to the base plate 1203 with the insulating member 1305 interposed therebetween.

The insulating plates 1305a and 1305b made of resin that are vertically stacked are arranged with through-holes matching the temperature sensor 1315 and the power receiving connector 1310 penetrating therethrough. In the present embodiment, in a state in which the temperature sensor 1315 and the power receiving connector 1310 are attached to the base plate 1203, a predetermined gap is arranged between the inner periphery wall surface of the through-hole of the insulating plates 1305a and 1305b, the outer peripheral side wall surface of the temperature sensor 1315 and the outer peripheral side wall surface of the power receiving connector 1310.

Each of the temperature sensors 1315 of the present example includes a thermocouple corresponding to a sensor main body which has a rod-like shape at an upper part, is disposed in a region on the center side along an axis thereof, and extends in the axial direction, a metal sheath which has a predetermined height in the axial direction and is arranged to surround the outer periphery of the thermocouple, and a connector portion connected or coupled to the sheath and the thermocouple and attached to the lower surface of the base plate 1203. The connector portion is insulated from the thermocouple, and is connected to a cable which is electrically connected to the thermocouple through the inside, and from which a signal from the thermocouple is transmitted through the inside. A plurality of cables from the connector portion of each temperature sensor 1315 is connected to one sensor cable connector unit 1316 connected to the lower surface of the base plate 1203 and is connected as a group of cables from the sensor cable connector unit 1316 to the vessel controller 1209 so as to communicate with each other.

Each temperature sensor 1315 is inserted into the through-hole from below the base plate 1203 through a plurality of positions of the base plate 1203, the insulating plates 1305a and 1305b disposed at corresponding locations above the positions, and through-holes disposed at a plurality of positions of the lower base material 1306b, and the thermocouple and a distal end portion of the sheath are inserted into cylindrical recessed portions disposed at positions corresponding to the through-holes of the upper base material 1306a. In a state in which the connector portion is attached to the base plate 1203, the thermocouple of each temperature sensor 1315 is not in contact with the inner wall surface of the recessed portion of the upper base material 1306a.

The through-hole into which each temperature sensor is inserted and the recessed portion of the upper base material 1306a disposed at a position corresponding to the through-hole are disposed at different positions in the radial direction and the circumferential direction with respect to the upper surface of the sample stage 241 or the base material 1306 having the cylindrical or disc shape. In this state, a signal that the thermocouple of the temperature sensor 1315 has detected the temperature is transmitted to the vessel controller 1209, and the arithmetic unit disposed inside the vessel controller 1209 detects temperature values and a distribution thereof at positions of the respective temperature sensors 1315 according to a software algorithm stored in the storage device included therein.

In a state in which the connector portion of the temperature sensor 1315 is attached to the base plate 1203, the metal sheath of each temperature sensor 1315 comes into contact with the base plate 1203 and is electrically connected thereto at a connecting portion with respect to a lower end portion thereof or the connector portion. In addition, the sheath of each temperature sensor 1315 has a cylindrical shape arranged at a distance from the outer peripheral side of the thermocouple to surround the thermocouple, and is insulated from the thermocouple.

The sheath of each temperature sensor 1315 is disposed at a distance from the base material 1306 in a state in which each temperature sensor 1315 is inserted into and attached to the sample stage 241 from the lower side of the base plate 1203. That is, the sheath is electrically insulated from the base material 1306 and is electrically connected to the base plate 1203.

The base plate 1203 is electrically connected to the base plate 260 which is brought to the ground potential via the sample stage base 242 and the lower container 250 on a lower side, and is set to the ground potential. For this reason, the sheath of each temperature sensor 1315 is set to the ground potential so that a component of the high frequency power supplied from the second high frequency power supply 243 to the base material 1306 is inhibited from being superimposed on a signal output from the temperature sensor 1315 to become noise, and a value of a temperature of the inside or the upper surface of the sample stage 241 in the vessel controller 1209 or accuracy of detection of a distribution in the radial direction or the circumferential direction is inhibited from being impaired.

In the present embodiment, as described above, high frequency power output from the second high frequency power supply passes through a cable for power supply and is supplied to the base material 1306 connected by the power receiving connector 1210 inserted to a central portion through the power supply connector 1309 connected to one end thereof and disposed at the central portion of the storage space 1207 below the base plate 1203 and the power receiving connector 1210 connected thereto. Through-holes into which the power supply connector 1309 and the power receiving connector 1310 are inserted are disposed at central portions of the insulating plates 1305*a* and 1305*b* between the base material 1306 and the base plate 1203.

One end of an end portion exposed to the storage space 1207 of the power supply connector 1309 attached to the lower surface of the base plate 1203 is connected to the feeder cable connected to the second high frequency power supply 243. The magnitude or amount of high frequency power output according to the command signal from the vessel controller 1209 is adjusted by the second high frequency power supply 243 connected to the vessel controller 1209 such that communication is allowed, and the magnitude and a distribution of a bias potential formed above the head portion 1201 are adjusted by high frequency power supplied through the power receiving connector 1310.

In the present embodiment, the power receiving connector 1310 is a member having an L shape or an inverted T shape. The power receiving connector 1310 is electrically connected to an upper member (upper portion) made of a conductive material such as metal and an upper end thereof and has a connection terminal connected to the power supply connector 1309 at the lower end portion thereof, and has a lower member (lower portion) having an L shape or an inverted T shape.

The power receiving connector 1310 is inserted into the through-hole disposed in the central portion of the base plate 1203 and the insulating plate 1305*a* or the insulating plate 1305*b*, and the lower portion thereof is inserted into the through-hole and attached to the lower surface of the base plate 1203 in a state in which the upper portion and the lower portion are connected to each other.

The upper portion of the power receiving connector 1310 is a metal rod-like member, and is inserted into a through-hole at the central portion of the lower base material 1306*b* so as to penetrate therethrough, inserted into an engagement hole corresponding to the recessed portion formed in the central portion of the upper base material 1306*a* above the through-hole, and electrically connected to the upper base material 1306*a*. In addition, the lower end portion of the upper portion is fit into the recessed portion disposed in the metallic connection terminal in the lower portion while being connected to the lower portion of the power receiving connector 1310.

The lower portion of the power receiving connector 1210 is a member having an L shape or an inverted T shape. Further, a path for power supply connected to a terminal connected to the lower end portion of the metallic upper portion and a terminal connected to the power supply connector 1309 at the lower end portion of L or inverted T shape between these terminals is included inside a member made of a dielectric or insulator material.

A terminal having an engagement hole to which the lower end portion of the metal rod-like member constituting the upper portion is fitted and connected is disposed in the upper end portion of the lower portion in a state in which the upper portion and the lower portion of the power receiving connector 1210 are integrally connected to each other. Further, the L-shaped or inverted T-shaped lower portion of the power receiving connector 1210 is exposed to the storage space 1207 below the lower surface of the base plate 1203 in a state in which the upper portion and the lower portion are connected to each other, and the power supply connector 1309 disposed inside the storage space 1207 is connected to a connection terminal of one end thereof.

The power supply connector 1309 is a connector for supplying high frequency power which is disposed at a central portion of a main body made of a dielectric or insulator material and includes a connection terminal electrically connected to a feeder cable through which high frequency power from the second high frequency power supply 243 flows. The connection terminal is exposed to one end thereof, and the other end portion is connected to the feeder cable or the feeder cable that is electrically connected to the connection terminal on the inside is drawn out and extends.

The power supply connector 1309 connected to the second high frequency power supply 243 through the feeder cable is configured to be attachable to and detachable from the power receiving connector 1210 inside the storage space 1207. The attachment and detachment are performed with respect to the end portion of the L-shaped or inverted T-shaped lower portion of the power receiving connector 1210 attached to the head portion 1201 or the base plate 1203 and exposed to the inside of the storage space 1207 below the lower surface of the base plate 1203.

In the present embodiment, an upper end portion of the power supply connector 1309 from which a feeder cable for electrically connecting the second high frequency power supply 243 is drawn out is attached to the lower portion of the power receiving connector 1310 in a state in which the portion is exposed below the lower surface of the base plate 1203 and attached thereto. Further, the power supply connector 1309 and the power receiving connector 1310 are configured to be attachable and detachable in a state in which the base plate 1203 is integrally attached to the insulating member 1305 and the base material 1306 on the upper side, and the head portion 1201 is configured to be integrally attachable to and detachable from the sample stage base 242.

In addition, an insulating boss having a cylindrical shape or a ring shape made of a material having insulating properties such as ceramics or a dielectric material is provided at an outer peripheral side of a position at which a bar-shaped upper portion and lower portion of the power receiving connector 1310 are connected to surround the position. The insulating boss is a member disposed between the insulating plate 1305a or 1305b and the base plate 1203 and a position at which the upper portion and the lower portion of the power receiving connector 1310 are connected in the radial direction at the central portion of the insulating plates 1305a and 1305b and the base plate 1203 with a gap therefrom to have a gap between the lower surface of the lower base material 1306b and the upper surface of the base plate 1203 in the vertical direction in a state in which the power receiving connector 1310 is attached to the head portion 1201, and insulates the feed path of the power receiving connector 1310 therefrom.

In the head portion 1201 of the present embodiment, first, the upper portion of the power receiving connector 1310 is attached to the base material 1306, and the upper portion and the base material 1306 are connected to each other. Thereafter, the insulating ring 1305' and the insulating plates 1305a and 1305b on a central side thereof are disposed at a lower side of the lower surface of the base material 1306 in the figure, and the upper portion of the power receiving connector 1310 is inserted into the through-hole on the inside at the central portion so that the insulating boss is disposed.

Thereafter, the base plate 1203 and the base material 1306 are fastened using the bolt 1308 with the insulating member 1305 and the insulating boss interposed therebetween. The insulating boss made of a ceramic material is disposed between the power receiving connector 1310 and the base plate 1203 and disposed such that upper and lower end surfaces thereof face the lower surface of the central portion of the base material 1306 and the upper surface of the central portion of the base plate 1203 through a slight gap, functions as a member that insulates between the base material 1306 and the base plate 1203 similarly to the insulating member 1305, and functions as a member that inhibits a distance (height) of a vertical space therebetween from being less than or equal to a desired value.

As illustrated in FIG. 13B, the plurality of heater power supply connectors 1322 electrically connected to each lower surface of the plurality of heater electrodes 1312 inside the dielectric film 1307 is disposed in the head portion 1201. The connection cable 1323 included in the feed path to the heater electrode 1312 is drawn from the connection terminal on the inside and connected to a heater power supply connector unit upper portion 1324a of a heater power supply connector unit 1324 located above the upper surface of the base plate 1203, and each lower end portion of the heater power supply connectors 1322 is configured to receive DC power from the DC power supply 1321 for the heater through the heater power supply connector unit 1324.

The heater power supply connector unit 1324 includes the heater power supply connector unit upper portion 1324a attached to the base plate 1203 and exposed above the upper surface of the base plate 1203 and a heater power supply connector unit lower portion 1324b detachably attached to a lower surface of the heater power supply connector unit upper portion 1324a from below, electrically connected to a feed path on the inside, and electrically connected to the DC power supply 1321 for the heater.

A through-hole arranged in accordance with a position of each heater power supply connector 1322 inside the base material 1306 is provided in each of the insulating plates 1305a and 1305b, and the lower end portion of the heater power supply connector 1322 is stored in each through-hole with a gap around the lower end portion in a state in which each of the insulating plates 1305a and 1305b is interposed between the base material 1306 and the base plate 1203 to integrally form the head portion 1201. In a state in which the insulating plates 1305a and 1305b are interposed between the base material 1306 and the base plate 1203 to integrally form the head portion 1201, a gap is formed therebetween, and a plurality of connection cables 1323 electrically connecting between each heater power supply connector 1322 and the heater power supply connector unit 1324 is disposed inside the gap.

Each heater power supply connector 1322 of the present embodiment includes a cylindrical boss made of a dielectric or insulator material and a connection terminal disposed therein. In a state in which the heater power supply connector 1322 is inserted into and attached to the base material 1306, an upper end portion of the connection terminal is electrically connected to the connection terminal on the heater electrode 1312 side, and a lower end portion of the connection terminal is electrically connected to the connection cable 1323.

Each heater power supply connector 1322 is inserted into an insertion hole formed by a through-hole of the lower base material 1306b and a cylindrical hole arranged in the upper base material 1306a, and is fit to and comes into contact with a heater-side connection terminal which is disposed at an upper end portion (bottom portion) inside the insertion hole, is electrically connected to the heater electrode 1312 on the upper side, and extends downward in a state of being insulated from the base material 1306 surrounding the outer periphery on the inside of the boss. In this way, the heater electrode 1312 and the DC power supply 1321 for the heater are electrically connected inside the insertion hole which communicates with the inside of the storage space 1207 and is set to an atmospheric pressure.

Each feeder cable 1323 connects the lower end portion of each heater power supply connector 1322 to the upper portion 1324a of the heater power supply connector unit 1324 located above the upper surface of the base plate 1203 in a gap between the insulating plates 1305a and 1305b. The heater power supply connector unit lower portion 1324b is connected to the DC power supply 1321 by one or a group of feeder cables, and DC power from the DC power supply 1321 for the heater is supplied to the plurality of heater electrodes 1312 in parallel through each connection cable 1323 branching from the heater power supply connector unit upper portion 1324a and each heater power supply connector 1322 connected thereto.

In the present embodiment, the insulating plates 1305a and 1305b made of the resin material are disposed to have a gap from a member disposed around the insulating plates 1305a and 1305b. Even when the base material 1306 is deformed according to the temperature during the processing of the wafer 300, a connecting portion between the end portion of the feeder cable 1323 and the heater power supply connector 1322 or the heater power supply connector unit 1324 is inhibited from being damaged or cut.

The outer periphery ring 1202 of the present embodiment is a ring-shaped member which is disposed on the outer periphery of the sample stage 241 to cover surroundings thereof, and is roughly divided into a susceptor ring 1325, a cover ring 1326, and a confinement ring 1327. These members are merely placed on the outer peripheral side of the sample stage 241 without having means for fastening to the sample stage 241 or mutually fastening with respect to the sample stage 241.

In a state in which the outer periphery ring 1202 is placed on the sample stage 241, the susceptor ring 1325 is disposed on the upper outer peripheral side of the upper base material 1306a, the cover ring 1326 is disposed around the outer peripheral side surface of the head portion 1201 below the susceptor ring 1325 and above the base plate 1203, and the confinement ring 1327 is disposed on the outer peripheral side of the cover ring 1326 above the base plate 1203. In addition, a gap having a predetermined size is disposed between surfaces of these members facing each other.

In the present embodiment, in the outer periphery ring 1202, after the cover ring 1326 is attached to the sample stage 241 or the head portion 1201, the susceptor ring 1325 and the confinement ring 1327 are attached to the sample stage 241 in order. Hereinafter, a description will be given in the order in which the confinement ring 1327 and the susceptor ring 1325 are mounted after the cover ring 1326 is mounted. However, the susceptor ring 1325 may be mounted first depending on the shape or the specification of the sample stage.

First, the cover ring 1326 is a member having a ring shape or a cylindrical shape made of a ceramic material such as alumina or yttria. On the outer peripheral side of the cylindrical outer peripheral side wall of the insulating ring 1305' of the insulating member 1305 having the cylindrical outer wall shape of the head portion 1201 configured by fastening the base plate 1203 and the base material 1306 with the insulating member 1305 interposed therebetween, the inner periphery wall surface is fit from above with a predetermined gap and placed on the upper surface of the outer periphery edge portion of the base plate 1203.

In the present embodiment, the size (height) of the inner periphery wall surface of the cover ring 1326 is set to be the same as that of the outer peripheral side wall of the insulating ring 1305'. However, the invention is not restricted to this configuration, and the outer peripheral side wall of the insulating ring 1305' is covered. In addition, a flat upper end surface of the cover ring 1326 is placed to cover the upper surface between the outer periphery edge of the insulating ring 1305' and the outer periphery edge of the upper surface of the base plate 1203 while being placed above the upper surface of the base plate 1203.

The confinement ring 1327 is a ring-shaped member having coating made of a ceramic material such as alumina or yttria on a surface of a metallic base material, and a longitudinal section includes a cylindrical inner peripheral side portion and a ring plate-shaped flange portion extending from the upper end portion of the inner peripheral side portion in an outer periphery direction. In this regard, the confinement ring 1327 is a member having an inverted L-shaped cross section.

A diameter of the cylindrical inner peripheral side wall of the inner peripheral side portion of the confinement ring 1327 is set to be slightly larger than a diameter of the outer peripheral side wall of the cover ring 1326, and the confinement ring 1327 is placed above the upper surface of the outer periphery edge portion of the base plate 1203 on the outer peripheral side of the cover ring 1326 by being fit to the outer peripheral side of the cover ring 1326 from above with a gap in a state in which the cover ring 1326 is mounted on the sample stage 241. In this state, the cover ring 1326 and the confinement ring 1327 are inserted from above the outer periphery edge portion of the base plate 1203 on the outer peripheral side of the insulating ring 1305' to cover an upper part of a plurality of bolts fastening the base plate 1203 and the T flange 1205 with respect to the vacuum processing chamber 2001.

A metallic base material is exposed on a bottom surface of the cylindrical inner peripheral side portion of the confinement ring 1327. In a state in which the confinement ring 1327 is placed on the upper surface of the outer periphery edge portion of the base plate 1203 on the outer peripheral side of the cover ring 1326, and the confinement ring 1327 and the upper surface come into contact with each other, this exposed bottom surface and the exposed metallic member of the base plate 1203 come into contact with each other and are electrically connected to each other.

For this reason, the confinement ring 1327 is electrically connected to the lower container 250 through the base plate 1203 and the T flange 1205, and is similarly set to the ground potential during processing of the wafer 300. The flange portion of the confinement ring 1327 set to such a potential is disposed to surround the sample stage 241 in a space from the inner periphery wall surface of the vacuum processing chamber 2001 on the outer peripheral side of the sample stage 241 inside the vacuum processing chamber 2001.

A plurality of through-holes penetrating the upper and lower surfaces in the vertical direction is disposed in the flange portion having the ring disc shape of the confinement ring 1327. A space of the vacuum processing chamber 2001 on the outer peripheral side of the sample stage 241 serves as a so-called passage in which plasma formed in a space above the sample stage 241, gas supplied into the vacuum processing chamber 2001, or a particle such as a reaction product formed during processing of the wafer 300 passes downward, moves to a bottom of the sample stage 241, and is discharged.

The confinement ring 1327 moves a gas particle or a neutral particle in plasma through a through-hole when the flange portion thereof is disposed across a direction of the flow inside the passage, so that a charged particle in the plasma is inhibited from moving downward. That is, plasma is inhibited from arriving at the outer peripheral side wall surface of the sample stage 241 or the sample stage base 242 below the confinement ring 1327 or the surface of the inner wall surface of the vacuum processing chamber 2001 to cause interaction with a material of a member included therein or adhering to a surface thereof.

Further, a so-called electrode which is set to the ground potential is disposed at a position corresponding to a passage on the outer peripheral side of the sample stage 241 close to the placement surface of the wafer 300 on the upper surface of the head portion 1201 or the base material 1306 in the height direction to surround the outer periphery of the sample stage 241 or the wafer 300 on the placement surface. Electric connection between the confinement ring 1327 and the base plate 1203 is stably maintained. Further, when the upper surface of the bolt for fastening the head portion 1201 onto the T flange 1205 is covered by the electrode, plasma, a charged particle, or a particle having reactivity is inhibited from coming into contact with the bolt to cause interaction, occurrence of abnormal discharge of plasma during processing of the wafer 300 is suppressed to perform stable processing, consumption of parts in the vacuum processing chamber 2001 resulting therefrom is suppressed, and reproducibility of processing of the wafer 300 is improved.

In the present embodiment, after the confinement ring 1327 is mounted on the outer peripheral side of the cover ring 1326, the susceptor ring 1325 is placed above the cover ring 1326 to surround the outer periphery of the upper portion of the head portion 1201. The susceptor ring 1325 is a ring-shaped member made of a ceramic material such as alumina or yttria.

The susceptor ring 1325 is disposed to surround the outer periphery of the placement surface of the wafer 300 at an outer periphery-side portion of the upper portion of the upper base material 1306*a*, and is inserted into the recessed portion whose surface has a lowered height (has a step) to cover the upper surface of the recessed portion or the outer periphery-side wall surface of the convex portion with respect to plasma inside the vacuum processing chamber 2001 by surrounding the placement surface of the wafer 300 having the circular shape made of the dielectric film 1307 corresponding to the upper surface of the cylindrical convex portion surrounded by the recessed portion of the upper base material 1306*a* or the wafer 300 placed thereon.

In a state in which the susceptor ring 1325 of the present embodiment is mounted in the recessed portion of the upper portion of the base material 1306, a position in the radial direction from the center of the base material 1306 of the inner periphery edge or the placement surface of the wafer 300 is slightly larger than a position in the radial direction of the convex portion surrounded by the recessed portion or the outer periphery edge of the placement surface, and a gap is disposed therebetween. In addition, in a state in which the wafer 300 is placed on the placement surface, a position of the outer periphery edge of the wafer 300 in the radial direction is larger than the inner periphery edge of the susceptor ring 1325 to the outer peripheral side. As a result, in a state in which the wafer 300 is placed and held on the placement surface, the outer periphery edge is overhung radially outward from the convex portion and the inner periphery edge of the susceptor ring 1325 located on the outer peripheral side thereof.

Further, a height of the upper surface of the susceptor ring 1325 of the present embodiment is smaller than a height of the placement surface of the upper base material 1306*a* or a height of the placement surface of the dielectric film 1307 or the flat upper surface of the ring protrusion 1307' by the dielectric film 1307 disposed at the outer periphery end portion of the convex portion to surround a central line portion. The wafer 300 is disposed such that the back surface of the outer periphery edge portion overhung on the placement surface covers the upper surface of the inner periphery edge portion of the susceptor ring 1325 on a lower side thereof.

Further, although not illustrated, the height of the upper surface on the outer peripheral side of the inner periphery edge portion of the susceptor ring 1325 is higher than that of the inner periphery edge portion, and thus an upper surface shape of the wafer 300 recessed (height is decreased) at a central side of the ring-shaped portion of the susceptor ring 1325 increased in height is disposed in a circular region. In this way, it is possible to direct the wafer 300 so as to be located on the center side more when the wafer 300 is placed on the sample stage 241 or the placement surface.

In addition, the vertical thickness of the susceptor ring 1325 of the present embodiment is larger at a portion on an outer peripheral side than a portion on an inner peripheral side. The portion of the susceptor ring 1325 on the inner peripheral side is placed on the upper surface (bottom surface) of the recessed portion while being fit into the recessed portion, and a thick portion on the outer peripheral side surrounds and covers the outer periphery of the outer peripheral side wall surface of the upper base material 1306*a*. Further, a flat lower surface of the portion on the outer peripheral side having an increased thickness is disposed to face the upper end surface of the cover ring 1326 with a gap. A size of the gap or the height position of the susceptor ring 1325 in the vertical direction is determined based on the thickness of the inner peripheral side portion coming into contact with the bottom surface of the recessed portion of the upper base material 1306*a*.

When a distance between plasma or a charged particle inside the vacuum processing chamber 2001 and the upper end of the bolt that fastens the base plate 1203 and the T flange is formed by the lower end surface of the susceptor ring 1325 and a gap between the cover ring 1326 and the confinement ring 1327, occurrence of interaction between the bolt and the plasma or the charged particle is suppressed.

Figure 14A:
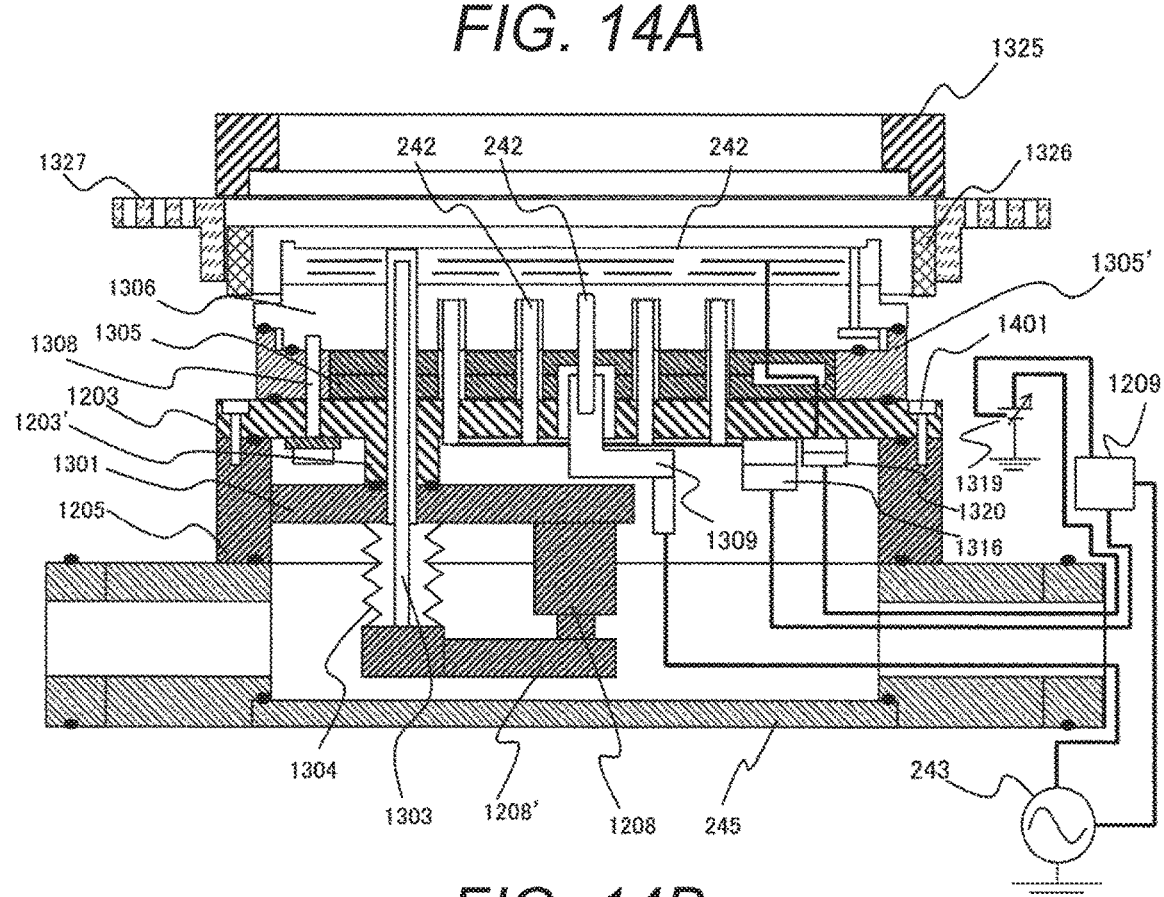
Figure 14B:
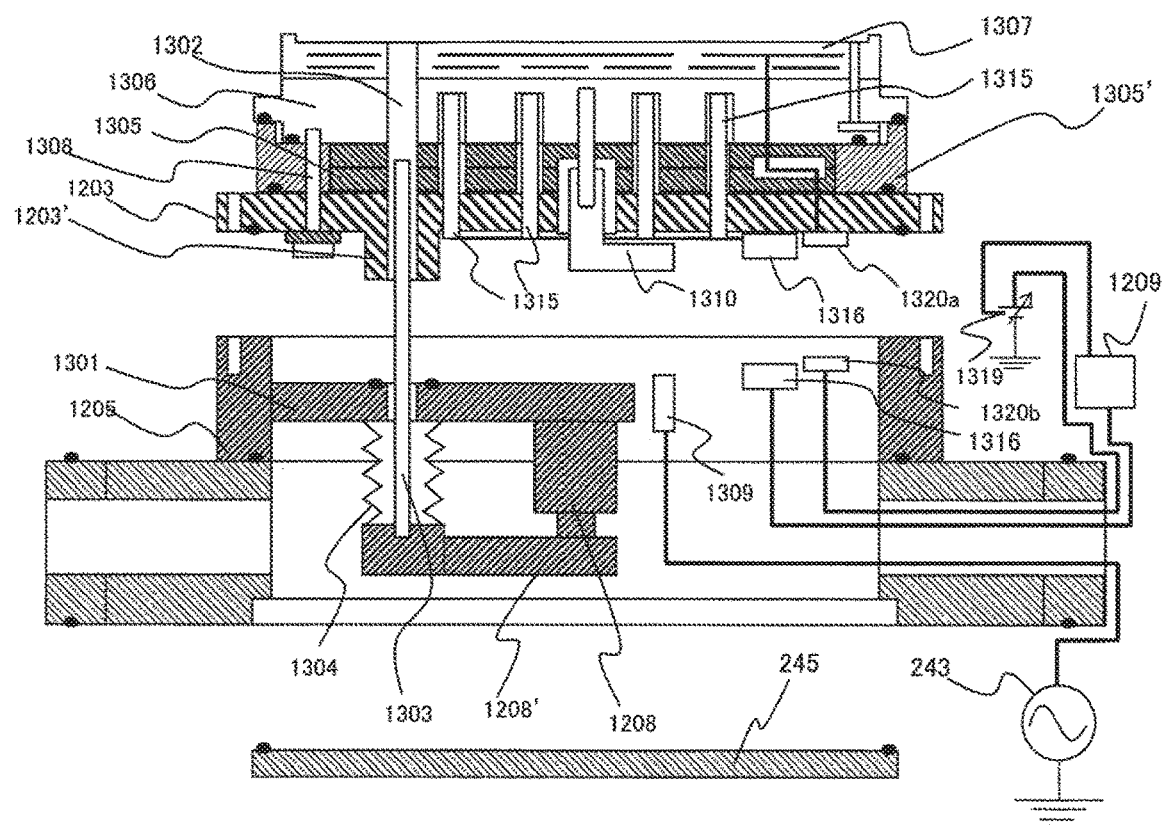

Hereinafter, a description will be given of a flow of an operation in which the sample stage 241 of the present embodiment is disassembled with reference to FIGS. 14A and 14B. FIGS. 14A and 14B are longitudinal sectional views schematically illustrating a state in which the sample stage according to the embodiment illustrated in FIGS. 12A and 12B and FIGS. 13A and 13B is disassembled into a plurality of components.

In the present figure, FIG. 14A illustrates a state in which the outer periphery ring 1202 is removed upward from the sample stage 241 while the head portion 1201 of the sample stage 241 is attached to the sample stage base 242. FIG. 14B illustrates a state in which the head portion 1201 is further removed above the sample stage base 242 from the state illustrated in FIG. 14A.

In the disassembly of the sample stage 241 illustrated in FIGS. 14A and 14B, when the vessel controller 1209 detects that the number of processed wafers 300 in the vacuum processing chamber 2001 or a cumulative value of time during which plasma is formed on the inside reaches a predetermined value, an operation of processing the wafer 300 is suspended in the vacuum processing chamber 2001 and changed to an operation for maintenance and inspection. In this operation for maintenance and inspection, the inside of the vacuum processing chamber 2001 is brought to an atmospheric pressure and opened, the operator performs an operation to remove a member inside the vacuum processing chamber 2001 to replace, clean, or wash the member, and then attach the member again.

Prior to such an operation, when it is confirmed that the processed wafer 300 has been taken out from the vacuum processing chamber 2001, the vessel controller 1209 instructs the user or the operator to perform the operation in an operation mode of maintenance and inspection. Thereafter, after sealing the inside of the vacuum processing chamber 2001 by closing the gate, a rare gas such as nitrogen or argon is introduced into the vacuum processing chamber 2001, and the pressure in the vacuum processing chamber 2001 is raised to the atmospheric pressure or a level that can be regarded as being equivalent to the atmospheric pressure.

Further, an upper side portion including the upper container 230 of the vacuum processing chamber 2001 is removed and eliminated from above the sample stage block using the turning lifter 210, etc. Then, after the sample stage 241 and the sample stage base 242 are slightly raised, the sample stage 241 and the sample stage base 242 are rotated around the vertical axis of the turning lifter 210, removed from the lower container 250, and moved to a space for maintenance around the base plate 260 from an upper side thereof.

In this state, a component or a member above and below the sample stage 241 and the sample stage base 242 is moved to a position at which an operation is not disturbed. Further, a space necessary for the operator to perform the operation is ensured, and efficiency of the operation is suppressed from being impaired.

In the present embodiment, first, the operator may remove the outer periphery ring 1202 from the sample stage 241. In FIG. 14A, the susceptor ring 1325, the cover ring 1326, and the confinement ring 1327 included in the outer periphery ring 1202 above the sample stage 241 attached to the sample stage base 242 seem to be schematically collectively removed. However, the susceptor ring 1325, the cover ring 1326, and the confinement ring 1327 are removed one by one.

As the time of removal, these members are removed in the order reverse to the order in which these members are attached to the sample stage 241. In more detail, contrary to the case described with reference to FIGS. 13A and 13B, the susceptor ring 1325, the confinement ring 1327, and the cover ring 1326 are removed in this order above the sample stage 241. In addition, in the present embodiment, members included in the outer periphery ring 1202 are not fastened to each other or to another member. For this reason, the operator only needs to detach these members upward from the sample stage 241 at the time of removal, the work volume is reduced, and the time required for maintenance and inspection work is reduced. When the cover ring 1326 of the outer periphery ring 1202 is detached from the sample stage 241, the sample stage 241 is exposed to the side of the upper surface operator of the bolt 1401 fastening the outer periphery edge portion of the base plate 1203 and the T flange 1205. In this state, the worker can easily remove the head portion 1201 of the sample stage 241 above the sample stage base 242 by releasing engagement therebetween.

In a state in which the outer periphery ring 1202 is detached from a position of the outer peripheral side thereof, the head portion 1201 of the sample stage 241 is detached integrally upward from the sample stage base 242. At this time, a plurality of bolts 1401 fastened to the upper end portion of the T flange 1205 on the outer peripheral side of the base plate 1203 is removed, the attachment of the sensor, the pipe and or the connector of the feeder cable to the lower surface of the base plate 1203 is released, and then the head portion 1201 is detached upward together with sensors, cables, connectors, etc. attached to the base plate 1203.

That is, in the present embodiment, the bolts 1401 arranged in the circumferential direction at equal angular intervals around the central axis of the sample stage 241 or at angular intervals similar thereto are detached from the upper surface outer peripheral side portion of the base plate 1203. Prior thereto, the sample stage bottom lid 245 constituting the bottom surface of the sample stage base 242 is removed downward, and the storage space 1207 is released downward. In this way, the operator may perform an operation of releasing attachment of the feeder cable, the sensor, or the connector of the pipe attached to the lower surface of the base plate 1203 from below the sample stage base 242, and thus work efficiency may be improved.

The operator accesses the interior of the storage space 1207 from below the sample stage base 242 opened downward to release connection between the power supply connector 1309 and the power receiving connector 1210, between the upper portion and the lower portion of the sensor cable connector unit 1316, between the upper portion and the lower portion of the ESC electrode connector unit 1320 and further between the heater power supply connector unit upper portion 1324a and the heater power supply connector unit lower portion 1324b. Similarly, although not illustrated, the operator releases connection between the pipe 1314 to which the refrigerant supplied to the refrigerant flow path 1313 is circulated and supplied and the base plate 1203 or the head portion 1201.

The operator may remove the head portion 1201, from which connection of the connector such as the cable, the pipe, etc. attached to the lower surface of the base plate 1203 is released, to a lower side of the sample stage base 242 in a state in which the plurality of temperature sensors 1315 or the heater power supply connector 1322 is disposed inside the base material 1306 or the insulating member 1305. At the time of taking out, the respective lower portions of the plurality of temperature sensors 1315 are attached to the lower surface of the base plate 1203 and positions thereof are fixed, the plurality of cables through which output signals flow is connected to the upper portion of the sensor cable connector unit 1316 attached to the base plate 1203 inside the storage space 1207 below the base plate 1203, and the lower portion of the sensor cable connector unit 1316 at which a group of a plurality of cables connects the vessel controller 1209 is cut off from above by the operator on the inside of the storage space 1207.

Similarly, the lower portions of the plurality of heater power supply connectors 1322 extend downward from the lower surface of the lower base material 1306b and are connected to the heater power supply connector unit upper portion 1324a through the feeder cable 1323 disposed to pass between the insulating plates 1305a and 1305b in a space inside the head portion 1201 communicating with the storage space 1207 on the inside of the insulating ring 1305' above the base plate 1203. Meanwhile, the heater power supply connector unit lower portion 1324b electrically connected to the DC power supply 1321 is disconnected from the heater power supply connector unit upper portion 1324a below the base plate 1203.

Similarly for another connector, connection with the head portion 1201 or coupling with the base plate 1203 is released by an operation from below by the operator in the inside of the storage space 1207 in which the sample stage bottom lid 245 constituting the bottom surface is opened.

In this way, in the present embodiment, during an operation for maintenance of the vacuum processing chamber 2001 started when the vessel controller 1209 detects that the number of processed wafers 300 in the vacuum processing chamber 2001 or a cumulative value of time during which plasma is formed reaches a predetermined value for performing maintenance such as replacement, inspection, etc. of a component, the head portion 1201 in which adhering substances are accumulated on the surface of the members constituting this member or members on the surface are consumed is integrally detached as a group of members (units), is replaced as a unit with a head portion 1201 which is prepared in advance and whose surface is cleaned or made of a newly manufactured member, and continues to be fastened to the upper end of the T flange 1205 of the sample stage base 242, in which the cover made of dielectric covering the surface of the new head portion 1201 is cleaned or replaced with a new one, by the plurality of bolts 1401.

As the time of upward removing of the upper portion of the sample stage 241 including the base plate 1203, referring to the lower end surface of the protrusion 1203', which is disposed on the lower surface of the base plate 1203, has a cylindrical shape or a truncated cone shape protruding downward from the lower surface, and has the through-hole 1303 through which the pins 1302 penetrate and stored inside disposed at the central portion, contact or facing with respect to the upper surface of the outer periphery of the through-hole for the pin 1302 disposed at each beam of the beam portion 1301 with a seal member such as an O-ring interposed therebetween, and sealing between a space on the inside of the through-hole for the pin of each beam and the through-hole 1303 in the head portion 1201 and the storage space 1207 on the outside are released, and the upper surface of the beam portion 1301 including the portion around the through-hole for the pin 1302 is exposed to the atmosphere.

As described above, the head portion 1201 formed by fastening the base plate 1203 of the sample stage 241 of the present embodiment and the base material 1306 with the insulating member 1305 interposed therebetween is configured such that the upper portion of the sample stage 241 including the base plate 1203 is integrally removable from the sample stage base 242 in a state in which the temperature sensor 1315, the heater power supply connector 1322, the sensor cable connector unit 1316 connected thereto by cables, and the upper portion of the heater power supply connector unit 1324 are attached. By exchanging as an integrated unit, the amount of work such as replacement of components during maintenance operation and adjustment after installation etc. is reduced, so that so-called down time at which the vacuum processing chamber 2001 does not operate for processing the wafers 300 is inhibited from increasing to decrease operation efficiency of the vacuum processing chamber 2001.

In the present embodiment, a space inside the head portion 1201 which is airtightly sealed by a sealing member such as an O-ring interposed between outer peripheral side portions of the base plate 1203, the insulating member 1305, and the base material 1306 and in which the temperature sensor 1315 and the heater power supply connector 1322 are arranged communicates with the storage space 1207 and is set to the atmospheric pressure or a pressure value approximate to a level that can be regarded as the atmospheric pressure during processing of the wafer 300. In this regard, the space inside the head portion 1201 corresponds to a so-called part of the storage space 1207.

The storage space 1207 is airtightly partitioned from the space inside the vacuum processing chamber 2001 in a state in which the head portion 1201 is mounted above the sample stage base 242 and placed in the vacuum processing chamber 2001. For this reason, even when the number of processed wafers 300 in the vacuum processing chamber 2001 or a cumulative value of time during which plasma is formed increases, not only the pressure but also gas and reactive particles do not enter the space surrounding the temperature detection portion of the temperature sensor 1315 and the contact portion between the connection terminals of the connector, and the fluctuation of the condition with the lapse of time is suppressed.

When the connection terminals of the temperature sensor 1315 and the heater power supply connector 1322 are arranged in an environment in which fluctuation of the condition is small in this way, the output of detection and the change in the detected result are suppressed as the cumulative number of processed wafers 300 or a plasma formation time increases. Further, reduction in the precision of the adjustment of the magnitude of electric power, refrigerant, etc. supplied to the electrode in the head portion 1201 is reduced based on a command signal for realizing a desired condition which is calculated and transmitted using the result of such detection. In this way, yield and reproducibility of processing of the wafer 300 in the vacuum processing chamber 2001 are improved.

In addition, in a case in which a distance to a detection target or a relative position of the arrangement changes, it is a common sense that a detector such as the temperature sensor 1315 disposed inside the head portion 1201 as a unit which is a unit of such a group requires a calibration operation of adjusting a correlation between an output signal as a result of detection each time the case occurs and a temperature to be detected to an actual value (or a value that is sufficiently approximate and can be regarded as the actual value) with an accuracy that is sufficient for driving. Meanwhile, in the present embodiment, the calibration of the temperature sensor 1315 attached when separately preparing only the previously prepared head portion 1201 is carried out before being attached to the sample stage base 242 of the vacuum processing chamber 2001 during the maintenance operation.

That is, calibration of the temperature sensor 1315 is performed by a single body of the head portion 1201 in a state in which the plurality of temperature sensors 1315 are attached to the head portion 1201 prepared for replacement, or by being placed on the sample stage base 242 facilitated for calibration such that the condition including the atmosphere is set the same condition as that during the processing of the wafer 300 or a condition approximate to a level that can be regarded as the condition. A surface of a member to which the plurality of temperature sensors 1315 subjected to calibration is attached is washed, or a head portion 1201 corresponding to a new product replaces a head portion 1201 used for processing of the wafer 300, and a difference between a condition of an environment such as the temperature and pressure inside the storage space 1207 after being attached to the sample stage base 242 or the amount of interaction with the particles inside the sample stage base 242 and a condition in which calibration is performed changes little over time. Thus, changes in accuracy of detection using the temperature sensor 1315 are suppressed.

When calibration is performed under atmospheric pressure before installation, the necessity of re-calibrating the temperature sensor 1315 after mounting the head portion 1201 above the sample stage 241 is reduced. Further, by omitting the necessity, the time required for the operation to prepare for the restart of the operation for processing the wafer 300 in the vacuum processing chamber 2001 after maintenance or inspection work is shortened. Furthermore, changes in the reproducibility of the processing of the wafer 300 performed in the vacuum processing chamber 2001 over time are suppressed, and the yield and efficiency of processing are improved.

Figure 15:
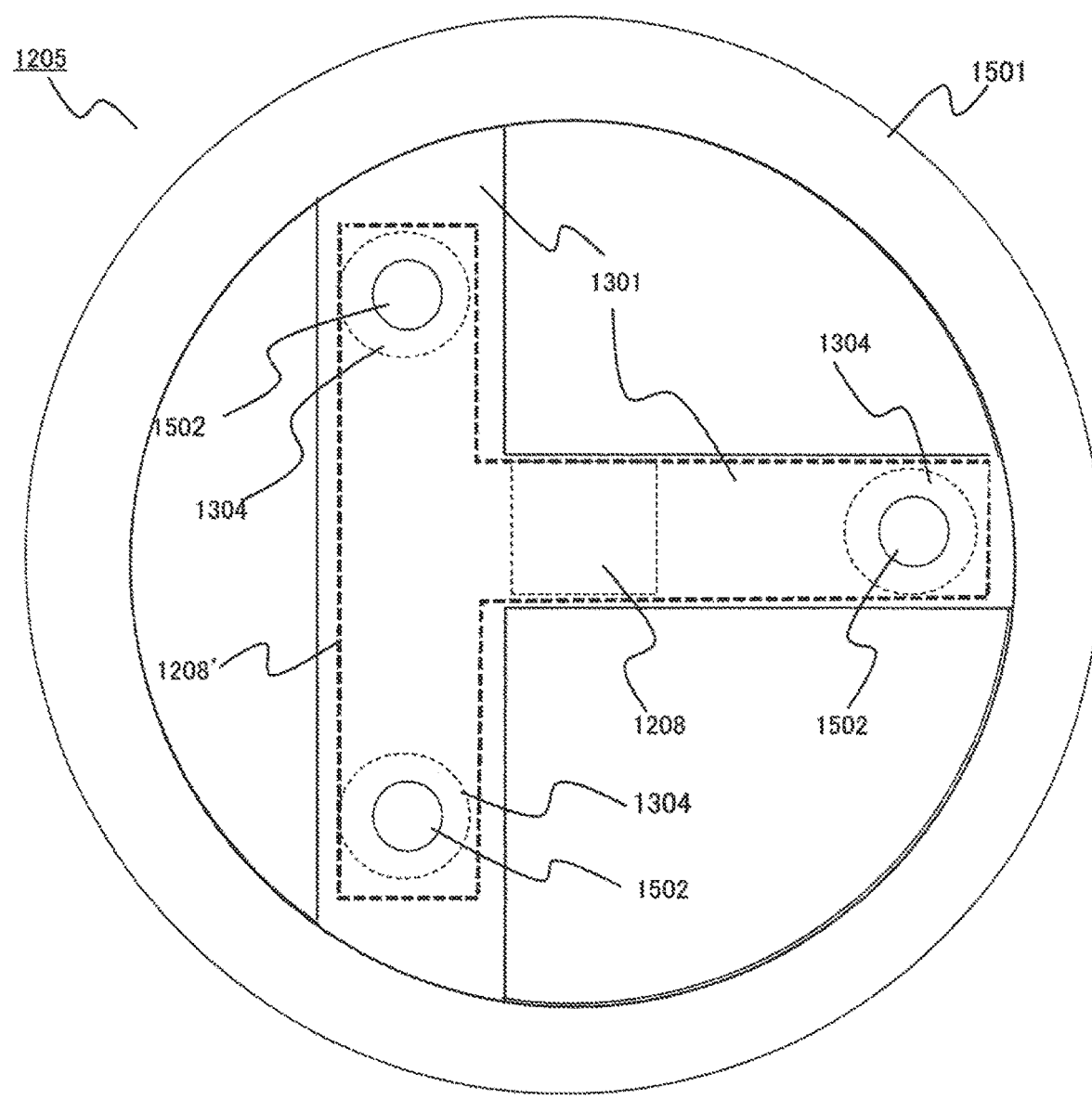
FIG. 15 is a top view schematically illustrating an outline of a configuration of a T flange of the vacuum processing chamber according to the embodiment illustrated in FIGS. 12A and 12B to FIGS. 14A and 14B.

A description will be given of a configuration of the T flange 1205 included in the present embodiment with reference to FIG. 15. FIG. 15 is a top view schematically illustrating an outline of the configuration of the T flange of the vacuum processing chamber according to the embodiment illustrated in FIGS. 12A and 12B to FIGS. 14A and 14B.

The T flange 1205 includes a cylindrical portion 1501 on an outer peripheral side included in the upper outer peripheral side wall of the sample stage base 242, and the beam portion 1301 disposed inside a cylindrical inner periphery wall surface thereof and integrally configured by connecting between the inner periphery wall surfaces. Further, the beam portion 1301 of the present embodiment includes three plate-shaped beams having a T-shaped or Y-shaped plan view seen from above and extending in the radial direction from the central portion of the cylindrical portion 1501, and through-holes 1502 for pins into which the pins 1302 are inserted are arranged in the respective beams.

Further, the pin driver 1208 is connected to the lower surface of the central portion of the beam portion 1301. The upper end portion of the pin driver 1208 is attached to the lower surface of the beam portion 1301 and positioned, and a cylindrical actuator whose length is shortened by a fluid or an electric motor such as a motor is provided at the lower end portion thereof. An arm 1208' corresponding to a T-shaped or Y-shaped plate member similarly to the beam portion 1301 is connected to a lower end of the actuator. Further, the bellows 1304 made of metal including a belt-shaped portion, which is connected from the upper surface of the arm 1208' around the lower end portions of the three pins 1302 and the lower end portions of the pins 1302 to the lower surface of the beam of the beam portion 1301 located above the part and extends and contracts in response to an increase or decrease in distance between the upper surface of the arm 1208' and the lower surface of the beam portion 1301 due to vertical movement of the arm 1208', is disposed in each of three distal end portions of the arm 1208' which is stored inside the storage space 1207 and vertically moves without coming into contact with the surrounding wall surface.

Furthermore, the ring-shaped lower surface of the protrusion 1203' of the base plate 1203 comes into contact with the upper surface of the beam portion 1301 on the outer peripheral side surrounding the through-hole 1502 with a seal member such as an O-ring interposed therebetween or faces the upper surface of the beam portion 1301 through a gap between end surfaces thereof. In surfaces of upper and lower ends of the bellows 1304, between the lower surface of the beam portion 1301 and the upper surface of the arm 1208', and the lower end surface of the protrusion 1203' and the upper surface of the beam portion 1301, an O-ring interposed therebetween comes into contact therewith, and a part between a space inside the through-hole 1502 in which the pin 1302 is stored and which includes the inside of the bellows 1304 and the storage space 1207 in an outer periphery portion is airtightly sealed.

Further, a space around the bellows 1304 communicates with the vacuum processing chamber 2001 through the through-hole 1303 of the base material 1306 in which the pin 1302 is stored on an upper side. That is, a part between the upper and lower surfaces of the beam portion 1301 and the upper surfaces of the bellows 1304 and the arm 1208' is a place at which a part between insides of the storage space 1207 and the vacuum processing chamber 2001 is airtightly sealed.

A part between the upper and lower end surfaces of the cylindrical portion 1501 and the lower surface of the outer periphery edge portion of the base plate 1203 on an upper side and a part between the upper and lower end surfaces of the cylindrical portion 1501 and the upper end surface of the central cylinder of the base cylinder interpose a seal member such as an O-ring therebetween, and the storage space 1207 corresponding to an inner space of these members and the inside of the vacuum processing chamber 2001 corresponding to an outer space are airtightly sealed.

The beam portion 1301 of the T flange 1205 of the present embodiment has a T or Y shape when viewed from above at which three plate-shaped beams connecting facing positions of the inner periphery wall surface of the cylindrical portion 1501 to each other are connected to one portion at the central portion of the cylindrical portion 1501. The beam portion 1301 is a member integrally formed with or connected to the cylindrical portion, and a variation of positions of the upper and lower surfaces of the beam portion 1301 is suppressed even when an external force is applied to the beam portion 1301.

The upper end surface of the pin driver 1208 is connected and attached to the lower surface of the central portion of the beam portion 1301. A tubular actuator is provided at the lower end portion of the pin driver 1208 so that a distal end position moves in the vertical direction and a length thereof increases and decreases, an upper end portion of the actuator is stored inside the main body of the pin driver 1208, and a lower end portion thereof is connected to the arm 1208' having a T or Y planar shape which is the same as that of the beam portion 1301.

The arm 1208' of the present example includes three plate-shaped beams extending to the outer peripheral side from the central portion similarly to the beam portion 1301, and the pin 1302 is attached to the upper surface of the distal end portion thereof. A length of the beam of the arm 1208' is shorter than that of the beam portion 1301 on the upper side, and the distal end portion is disposed not to come into contact with a member inside the storage space 1207 in vertical movement of the height according to a vertical extension and contraction operation of the actuator of the pin driver 1208.

In addition, in response to vertical movement of the arm 1208', the pin 1302 vertically moves inside the through-holes 1303 and 1502 to lift and lower the wafer 300 supported by being placed on a distal end thereof.

According to the above-described configuration, an attachment position of the pin driver 1208 connected to the lower surface of the beam portion 1301 changes in response to driving of the pin driver 1208, and a seal between the ring-shaped lower end surface and the upper surface of the protrusion 1203' of the base plate 1203 connected with the O-ring connected to the upper surface thereof interposed therebetween is inhibited from being damaged. Thus, reliability of processing of the wafer 300 by the vacuum processing chamber 2001 is improved.

According to the above embodiment, so-called down time at which the vacuum processing chamber 2001 does not operate for processing the wafers 300 is inhibited from increasing to decrease operation efficiency of the vacuum processing chamber 2001.

In addition, by disposing the connection terminals of the temperature sensor 1315 and the heater power supply connector 1322 in an environment in which fluctuation of the condition is small, changes in the output of detection and the detected result due to the increase in the cumulative number of processed wafers 300 and plasma formation time are suppressed. Further, a decrease in precision of adjustment of the magnitude of electric power, refrigerant, etc. supplied to the electrode in the head portion 1201 based on a command signal for realizing a desired condition which is calculated and transmitted using the result of such detection and detection is reduced.

In this way, yield and reproducibility of the processing of the wafer 300 in the vacuum processing chamber 2001 are improved. In addition, the time required for the operation for preparation for restarting the operation for processing the wafer 300 in the vacuum processing chamber 2001 after maintenance or inspection work is shortened. Furthermore, changes in the reproducibility of the processing of the wafer 300 performed in the vacuum processing chamber 2001 over time are suppressed, and the yield and efficiency of processing are improved.

In the present embodiment, an ECR type vacuum processing apparatus is used as the vacuum processing apparatus. However, the invention is not limited thereto, and may be applied to an ICP type apparatus. In addition, a vacuum processing apparatus including a vacuum processing chamber arranged by a ring method is used. However, the invention is not limited thereto, and may be applied to a cluster type apparatus.

The invention is not limited to the above-described embodiment, and includes various modified examples. For example, the above-described embodiment has been described in detail in order to explain the invention in an easy-to-understand manner, and is not necessarily limited to those having all the configurations described. In addition, it is possible to replace a part of a configuration with another configuration, and another configuration can be added to a certain configuration.

The invention claimed is:

1. A vacuum processing apparatus comprising:
   a processing chamber disposed inside a vacuum vessel and depressurized by an inside being evacuated;
   a sample stage disposed inside the processing chamber, a wafer to be processed being disposed on an upper surface of the sample stage; and
   an opening communicating with an exhaust pump disposed below the sample stage to evacuate the inside of the processing chamber, wherein the wafer is processed using plasma generated in the processing chamber above the sample stage,
   wherein the sample stage includes a metallic base material having a film made of a dielectric, the wafer being placed on an upper surface thereof, a metallic base plate disposed below the base material and insulated from the base material with an insulating member interposed therebetween, and a cylindrical base member which is disposed below the base plate and which surrounds a space which is set to an atmospheric pressure therein, the base material and the insulating member being fastened to the base plate, and the base plate being connected to the cylindrical base member so as to cover said space,
   wherein the insulating member includes a ring-shaped first member having a large rigidity disposed in an outer peripheral region of the insulating member to interpose a seal member airtightly sealing an inner peripheral side space which communicates with an outside of the vacuum vessel and set to an atmospheric pressure from an inside of the processing chamber on outer peripheral regions of the base material and the base plate, and a plate-shaped second member having a small rigidity disposed in a region on an inner periphery side of the first member,
   wherein the vacuum processing apparatus further comprises a plurality of temperature sensors each of which penetrates the base plate and the second member of the insulating member, and which is inserted into the base material, and
   wherein the base plate fastened to the base material and the insulating member are removable upward to an outside of the processing chamber from the base material in a state in which the plurality of temperature sensors is installed.

2. The vacuum processing apparatus according to claim 1, wherein the insulating member includes a resin insulating plate disposed in an inner peripheral side region of the ring-shaped member between the base material and the base plate to insulate between the base material and the base plate, the insulating plate having a plurality of through-holes through which the plurality of temperature sensors penetrate.

3. The vacuum processing apparatus according to claim 1, wherein the base material and the base plate are fastened with the ring-shaped member interposed therebetween using a bolt.

4. The vacuum processing apparatus according to claim 2, wherein the base material and the base plate are fastened with the ring-shaped member interposed therebetween using a bolt.

5. The vacuum processing apparatus according to claim 1, further comprising:
   a flow path disposed inside the base material circulating refrigerant for adjusting the temperature of the base material; and
   a heater disposed inside the dielectric film.

6. The vacuum processing apparatus according to claim 2, further comprising:
   a flow path disposed inside the base material circulating refrigerant for adjusting the temperature of the base material; and
   a film-shaped heater disposed inside the dielectric film.

7. The vacuum processing apparatus according to claim 1, wherein the base plate is set to a ground potential.

8. The vacuum processing apparatus according to claim 1, wherein the base material and the base plate are fastened with the ring-shaped member interposed therebetween using a bolt.

9. The vacuum processing apparatus according to claim 1, further comprising:
   a flow path disposed inside the base material circulating refrigerant for adjusting the temperature of the base material; and
   a film-shaped heater disposed inside the dielectric film.

* * * * *